United States Patent
Choi et al.

(10) Patent No.: US 12,167,646 B2
(45) Date of Patent: Dec. 10, 2024

(54) PIXEL AND DISPLAY DEVICE INCLUDING THE SAME

(71) Applicant: Samsung Display Co., Ltd., Yongin-si (KR)

(72) Inventors: Wonwoo Choi, Hwaseong-si (KR); Jaechung Kim, Goyang-si (KR); Jaeik Lim, Hwaseong-si (KR); In-Bae Kim, Daejeon (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 434 days.

(21) Appl. No.: 17/709,848

(22) Filed: Mar. 31, 2022

(65) Prior Publication Data

US 2023/0045085 A1  Feb. 9, 2023

(30) Foreign Application Priority Data

Aug. 9, 2021 (KR) .................. 10-2021-0104693

(51) Int. Cl.
*H10K 59/124* (2023.01)
*H10K 59/131* (2023.01)

(52) U.S. Cl.
CPC ......... *H10K 59/124* (2023.02); *H10K 59/131* (2023.02)

(58) Field of Classification Search
None
See application file for complete search history.

(56) References Cited

U.S. PATENT DOCUMENTS

| | | | | |
|---|---|---|---|---|
| 9,812,518 B2* | 11/2017 | Kim | .................. | H01L 29/78675 |
| 9,876,064 B2 | 1/2018 | Kim et al. | | |
| 10,312,461 B2 | 6/2019 | Qin | | |
| 2009/0046041 A1* | 2/2009 | Tanikame | ........... | H01L 27/1255 |
| | | | | 345/76 |
| 2014/0034923 A1* | 2/2014 | Kim | ...................... | H10K 59/123 |
| | | | | 257/40 |
| 2014/0062292 A1* | 3/2014 | Seong | .................. | H10K 59/873 |
| | | | | 313/504 |
| 2016/0035795 A1* | 2/2016 | Lim | ................... | H10K 59/8792 |
| | | | | 257/40 |
| 2019/0304373 A1* | 10/2019 | Wang | .................... | H10K 59/131 |
| 2020/0005708 A1* | 1/2020 | Hwang | .............. | H10K 59/1213 |
| 2020/0303479 A1 | 9/2020 | Kim et al. | | |

FOREIGN PATENT DOCUMENTS

| KR | 1020160120388 A | 10/2016 |
|---|---|---|
| KR | 1020200113055 A | 10/2020 |
| KR | 1020210025567 A | 3/2021 |

\* cited by examiner

*Primary Examiner* — Bilkis Jahan
(74) *Attorney, Agent, or Firm* — CANTOR COLBURN LLP

(57) ABSTRACT

A pixel includes a light emitting element including an anode and a cathode, a first transistor connected between the anode and a first power line and switched by a voltage of a node, a second transistor connected between the first transistor connected to the first power line and a data line and switched by a write scan signal, a third transistor connected between the node and the anode and switched by a compensation scan signal, and an insulating layer covering the second and third transistors. A first groove is defined in a portion of the insulating layer adjacent to the third transistor.

20 Claims, 16 Drawing Sheets

12,167,646 B2

PIXEL AND DISPLAY DEVICE INCLUDING THE SAME

This application claims priority to Korean Patent Application No. 10-2021-0104693, filed on Aug. 9, 2021, and all the benefits accruing therefrom under 35 U.S.C. § 119, the content of which in its entirety is herein incorporated by reference.

BACKGROUND

1. Field

Embodiments of the disclosure described herein relate to a pixel and a display device including the pixel.

2. Description of the Related Art

In general, an electronic device, such as a smartphone, a digital camera, a notebook computer, a navigation, or a smart television, which provides a user with an image includes a display device for displaying the image. The display device generates an image and provides the user with the generated image on a display screen.

The display device may include a display panel including a plurality of pixels for generating an image and a driver for driving the pixels. Each of the pixels may include a light emitting element, a plurality of transistors connected to the light emitting element, and at least one capacitor connected to the transistors.

Recently, with the development of the technology of the display device, various types of display devices including various flexible display devices capable of being transformed into a curved shape or being foldable or rollable, for example, have been developed. Flexible display devices capable of being deformed in various ways may be easily carried and may improve convenience of a user.

SUMMARY

A flexible display device includes a flexible display panel. The flexible display panel may be vulnerable to an external impact. In the flexible display panel, some transistors may be damaged by an external impact, such that pixels may fail to normally operate.

Embodiments of the disclosure provide a pixel for preventing damage of transistors according to an external impact and a display device including the pixel.

According to an embodiment, a pixel includes a light emitting element including an anode and a cathode, a first transistor connected between the anode and a first power line, where the first transistor is switched by a voltage of a node, a second transistor connected between the first transistor connected to the first power line and a data line, where the second transistor is switched by a write scan signal, a third transistor connected between the node and the anode, where the third transistor is switched by a compensation scan signal, and an insulating layer covering the second and third transistors. In such an embodiment, a first groove is defined in a portion of the insulating layer adjacent to the third transistor.

According to an embodiment, a pixel includes a light emitting element including an anode and a cathode, a first transistor connected between the anode and a first power line, where the first transistor is switched by a voltage of a node, a second transistor connected between the first transistor connected to the first power line and a data line, where the second transistor is switched by a write scan signal, a third transistor connected between the node and the anode, where the third transistor is switched by a compensation scan signal, and an insulating layer covering the second and third transistors. In such an embodiment, a plurality of grooves is defined in portions of the insulating layer adjacent to the second and third transistors, and a depth of one of the grooves is different from a depth of another of the grooves.

According to an embodiment, a display device includes a pixel. The pixel may include a light emitting element including an anode and a cathode, a first transistor connected between the anode and a first power line, where the first transistor is switched by a voltage of a node, a second transistor connected between the first transistor connected to the first power line and a data line, where the second transistor is switched by a write scan signal, a third transistor connected between the node and the anode, where the third transistor is switched by a compensation scan signal, and an insulating layer covering the second and third transistors. In such an embodiment, a first groove and a second groove are defined in portions of the insulating layer adjacent to the third transistor, and the first groove and the second groove have different depths from each other.

BRIEF DESCRIPTION OF THE DRAWINGS

The above and other features of the disclosure will become apparent by describing in detail embodiments thereof with reference to the accompanying drawings, which.

DETAILED DESCRIPTION

Figure 1:
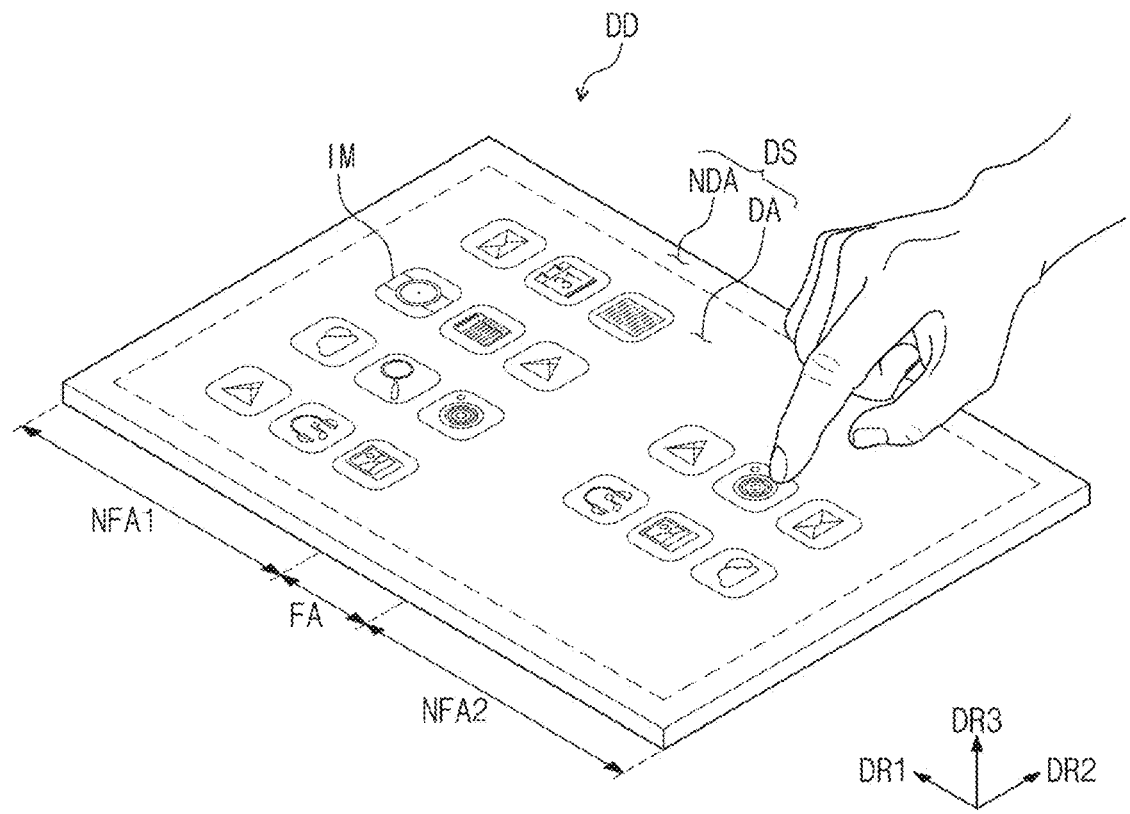
FIG. 1 is a perspective view of a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the specification, when an element (or an area, a layer, a part, or the like) is referred to as "being on", "being connected to", or "being coupled to" another element, this indicates that the element may be directly on/connected to/coupled to the other element or a third element may be therebetween. In contrast, when an element is referred to as being "directly on" another element, there are no intervening elements present.

Like reference numerals refer to like elements. Also, in the drawings, the thicknesses, the ratios, and the dimensions of the elements may be exaggerated for effective description of technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Although the terms such as "first", "second", or the like may be used herein to describe various elements, these elements should not be limited by these terms. These terms are only used to distinguish one element from another element. For example, a first element could be termed a second element without departing from the scope of the claims of the disclosure, and similarly a second element could be termed a first element. The singular forms are intended to include the plural forms unless the context clearly indicates otherwise.

In addition, the terms "under", "lower", "above", "upper", etc. are used to describe the correlation between the elements illustrated in the drawings. These terms are relative concepts and are described on the basis of the directions shown in the drawings.

Unless otherwise defined, all terms (including technical terms and scientific terms) used in the specification have the same meaning as commonly understood by one skilled in the art to which the disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 2:
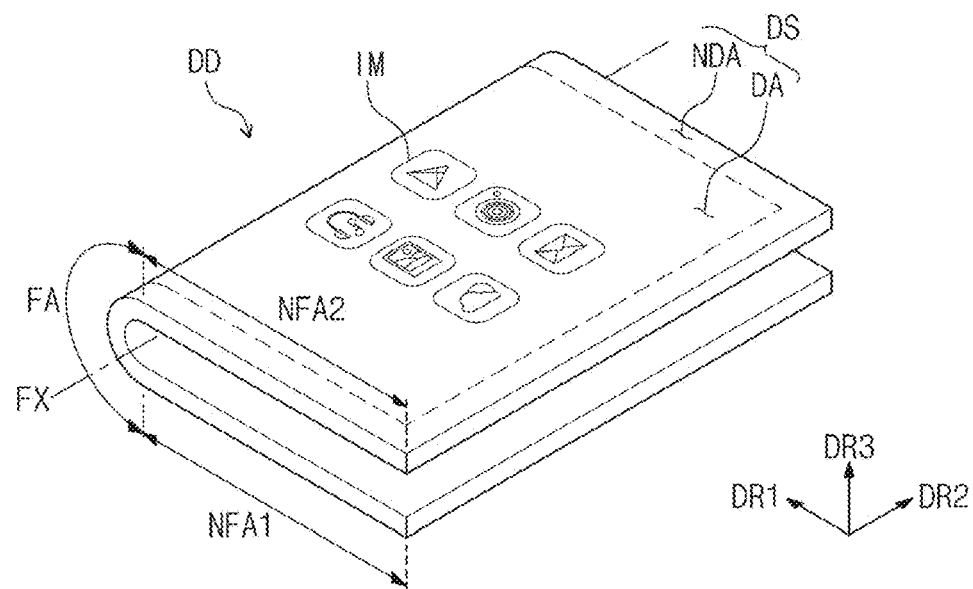
FIG. 2 is a perspective view of a display device shown in FIG. 1 in a folded state.

FIG. 1 is a perspective view of a display device according to an embodiment of the disclosure. FIG. 2 is a perspective view of a display device shown in FIG. 1 in a folded state.

Referring to FIG. 1, an embodiment of a display device DD may have a rectangular shape having long edges in a first direction DR1 and short edges in a second direction DR2 intersecting the first direction DR1. However, the disclosure is not limited thereto, and alternatively, the display device DD may have various shapes such as a circle and a polygon. The display device DD may be a flexible display device.

Hereinafter, a direction substantially perpendicularly intersecting a plane defined by the first direction DR1 and the second direction DR2 is defined as a third direction DR3. Furthermore, in the specification, "when viewed from a plane" may be defined as "in a state viewed from the third direction DR3".

In an embodiment, the display device DD may include a folding area FA and a plurality of non-folding areas NFA1 and NFA2. The non-folding areas NFA1 and NFA2 may include the first non-folding area NFA1 and the second non-folding area NFA2. The folding area FA may be disposed between the first non-folding area NFA1 and the second non-folding area NFA2. The folding area FA, the first non-folding area NFA1, and the second non-folding area NFA2 may be arranged in the first direction DR1.

An upper surface of the display device DD may be defined as a display surface DS and may be on a plane defined by the first direction DR1 and the second direction DR2. Images IM generated on the display surface DS by means of the display device DD may be provided to a user.

The display surface DS may include a display area DA and a non-display area NDA around the display area DA. The display area DA may display an image, and the non-display area NDA may not display an image. The non-display area NDA may surround the display area DA and may define a border of the display device DD printed in a certain color.

Referring to FIG. 2, the display device DD may be the foldable display device DD which is folded or unfolded. In an embodiment, for example, as the folding area FA is bent about a folding axis FX parallel to the second direction DR2, the display device DD may be folded. The folding axis FX may be defined as a short axis parallel to the short edge of the display device DD.

When the display device DD is folded, the first non-folding area NFA1 and the second non-folding area NFA2 may face each other, and in-folding of the display device DD may be performed such that the display surface DS is not exposed to the outside.

Figure 3:
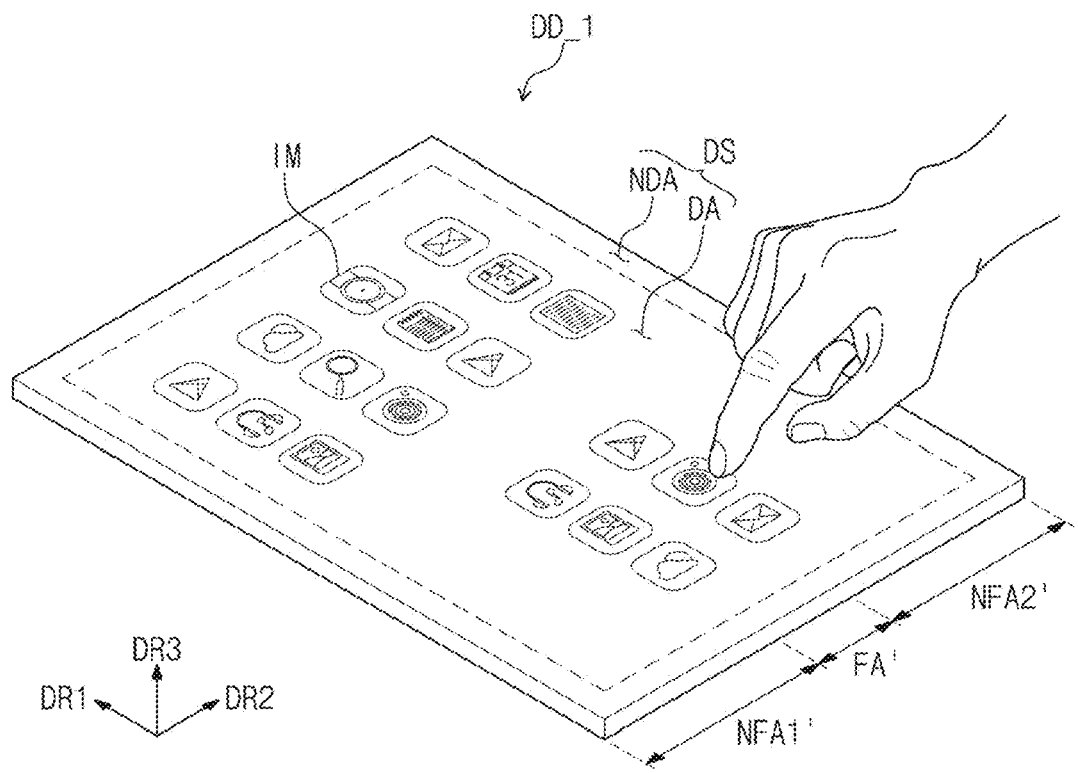
FIG. 3 is a perspective view of a display device according to an embodiment of the disclosure.
Figure 4:
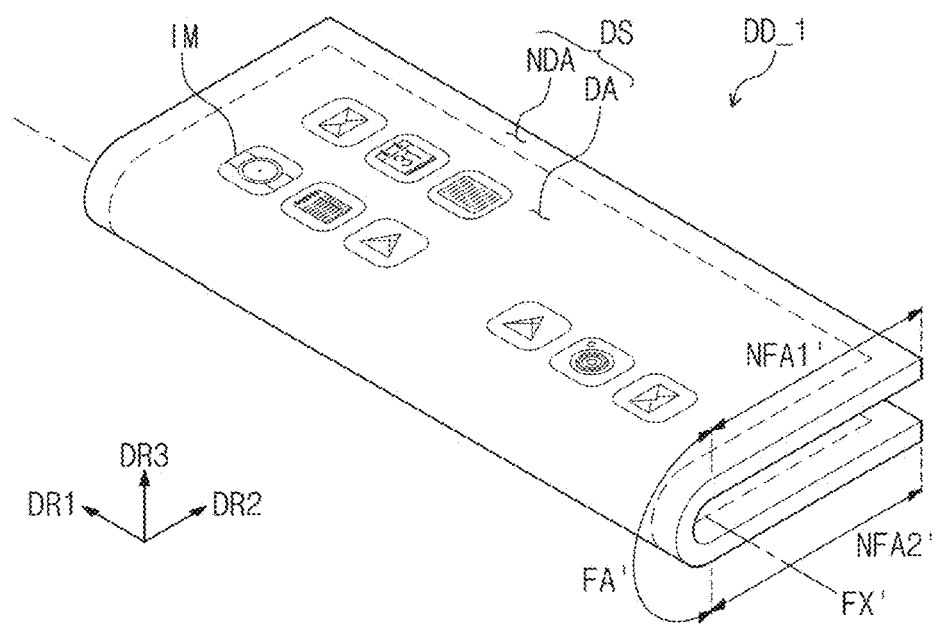
FIG. 4 is a perspective view of a display device shown in FIG. 3 in a folded state.

FIG. 3 is a perspective view of a display device according to an embodiment of the disclosure. FIG. 4 is a perspective view of a display device shown in FIG. 3 in a folded state.

Referring to FIGS. 3 and 4, an embodiment of a display device DD_1 may include a folding area FA' and a plurality of non-folding areas NFA1' and NFA2'. The non-folding areas NFA1' and NFA2' may include the first non-folding area NFA1' and the second non-folding area NFA2'. The folding area FA' may be disposed between the first non-folding area NFA1' and the second non-folding area NFA2'. The folding area FA', the first non-folding area NFA1', and the second non-folding area NFA2' may be arranged in a second direction DR2.

As the folding area FA' is bent about a folding axis FX' parallel to a first direction DR1, the display device DD_1 may be folded. The folding axis FX' may be defined as a long axis parallel to a long edge of the display device DD_1. A display device DD shown in FIG. 1 may be folded about a short axis, whereas the display device DD_1 shown in FIG. 3 may be folded about the long axis. In-folding of the display device DD_1 may be performed such that a display surface DS is not exposed to the outside.

Hereinafter, a structure of an embodiment of the display device DD foldable about the short axis will be described, but not limited thereto. Structures which will be described below may be applied to the display device DD_1 folded about the long axis.

Figure 5:
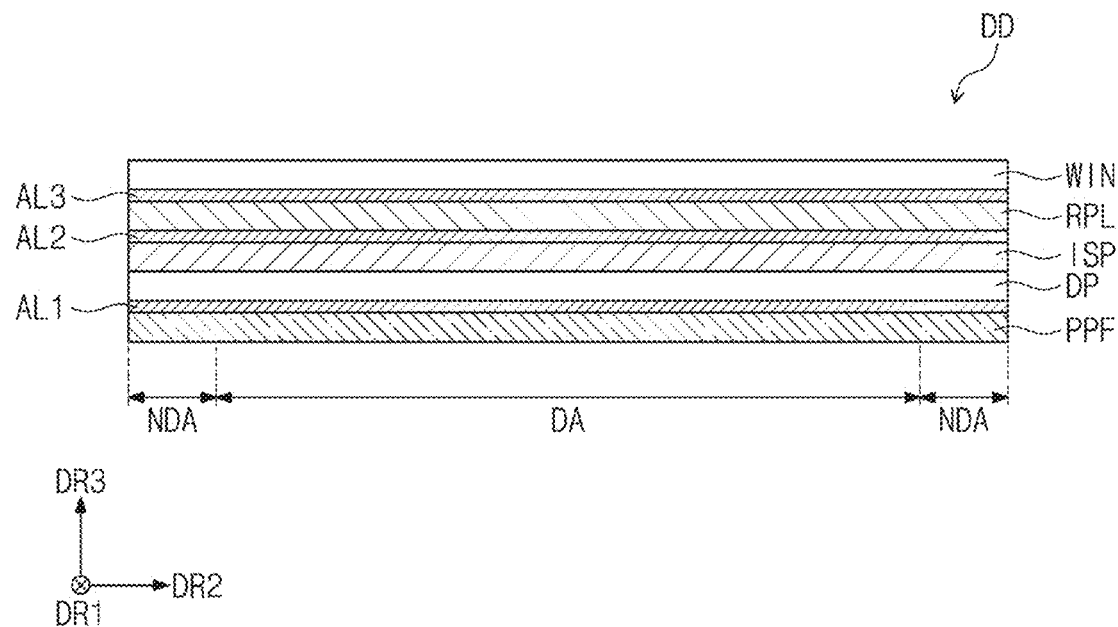
FIG. 5 is a drawing illustrating a cross section of a display device shown in FIG. 1.

FIG. 5 is a drawing illustrating a cross section of a display device shown in FIG. 1.

Particularly, FIG. 5 illustrates a cross section of an embodiments of a display device DD viewed from a direction DR1.

Referring to FIG. 5, an embodiment of the display device DD may include a display panel DP, an input sensing part ISP, an anti-reflection layer RPL, a window WIN, a panel protective film PPF, and first to third adhesive layers AL1-AL3.

In such an embodiment, the display panel DP may be a flexible display panel. In an embodiment, the display panel DP may be a light emitting display panel and is not particularly limited. In an embodiment, for example, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot, a quantum rod, and the like. Hereinafter, for convenience of description, embodiments where the display panel DP is the organic light emitting display panel will be described in detail.

The input sensing part ISP may be disposed on the display panel DP. The input sensing part ISP may include a plurality of sensing parts (not shown) for sensing an external input in a capacitive manner. When the display device DD is fabricated, the input sensing part ISP may be immediately fabricated on the display panel DP. However, the disclosure is not limited thereto, and the input sensing part ISP may be fabricated as a panel independent of the display panel DP to be attached to the display panel DP by an adhesive layer.

The anti-reflection layer RPL may be disposed on the input sensing part ISP. The anti-reflection layer RPL may be defined as an external light anti-reflection film. The anti-reflection layer RPL may reduce a reflectivity of external light incident toward the display panel DP from the top of the display device DD.

When external light propagated toward the display panel DP is reflected from the display panel DP and is then provided to an external user, the user may view the external light like a mirror. In an embodiment, the anti-reflection layer RPL may include a plurality of color filters for displaying a same color as pixels of the display panel DP to prevent such a phenomenon.

The color filters may filter external light in a same color as the pixels. In such an embodiment, the external light is not visible to the user. However, the disclosure is not limited thereto, and alternatively, the anti-reflection layer RPL may include a phase retarder and/or a polarizer to reduce a reflectivity of external light.

The window WIN may be disposed on the anti-reflection layer RPL. The window WIN may protect the display panel DP, the input sensing part ISP, and the anti-reflection layer RPL from an external scratch and impact.

The panel protective film PPF may be disposed under the display panel DP. The panel protective film PPF may protect a lower portion of the display panel DP. The panel protective film PPF may include a flexible plastic material such as polyethyleneterephthalate ("PET").

The first adhesive layer AL1 may be disposed between the display panel DP and the panel protective film PPF, and the display panel DP and the panel protective film PPF may be attached to each other by the first adhesive layer AL1. The second adhesive layer AL2 may be disposed between the anti-reflection layer RPL and the input sensing part ISP, and the anti-reflection layer RPL and the input sensing part ISP may be attached to each other by the second adhesive layer AL2. The third adhesive layer AL3 may be disposed between the window WIN and the anti-reflection layer RPL, and the window WIN and the anti-reflection layer RPL may be attached to each other by the third adhesive layer AL3.

Figure 6:
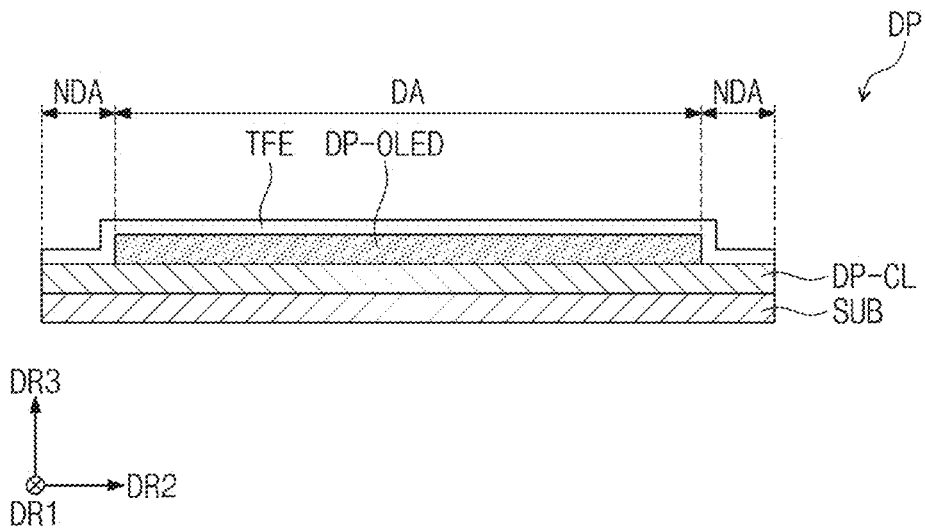
FIG. 6 is a drawing illustrating a cross section of a display device shown in FIG. 5.

FIG. 6 is a drawing illustrating a cross section of a display device shown in FIG. 5.

Particularly, FIG. 6 illustrates a cross section of an embodiment of a display panel DP viewed from a first direction DR1.

Referring to FIG. 6, an embodiment of the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include a display area DA and a non-display area NDA around the display area DA. The substrate SUB may include a flexible plastic material such as polyimide ("PI"). The display element layer DP-OLED may be disposed in the display area DA.

A plurality of pixels may be arranged in the circuit element layer DP-CL and the display element layer DP-OLED. Each of the pixels may include transistors disposed in the circuit element layer DP-CL and a light emitting element which is disposed in the display element layer DP-OLED to be connected to the transistor. The configuration of the pixel will be described in greater detail below.

The thin film encapsulation layer TFE may be disposed on the circuit element layer DP-CL to cover the display element layer DP-OLED. The thin film encapsulation layer TFE may protect pixels from moisture, oxygen, and foreign substances.

Figure 7:
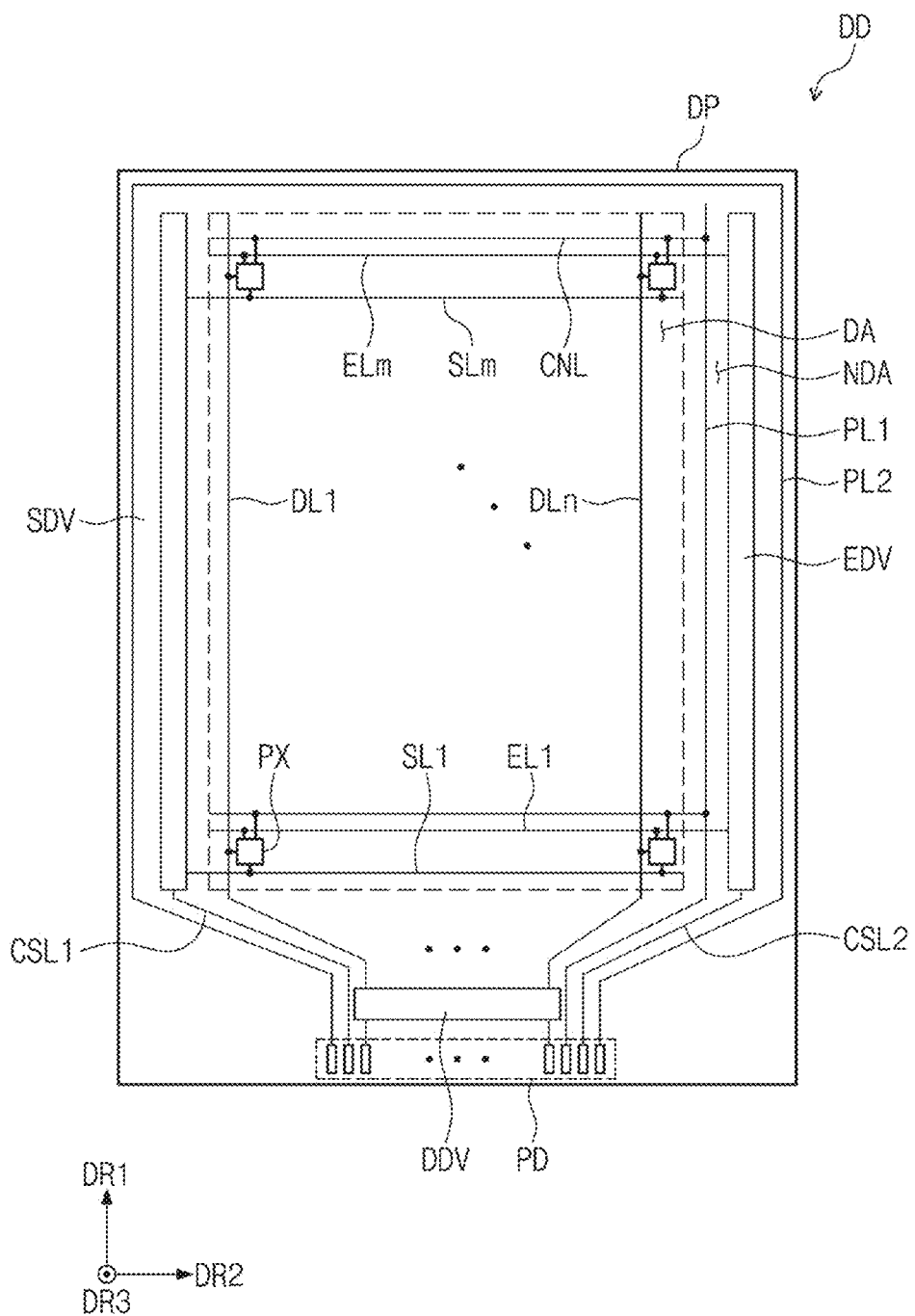
FIG. 7 is a plan view of an embodiment of a display panel shown in FIG. 5.

FIG. 7 is a plan view of an embodiment of a display panel shown in FIG. 5.

Referring to FIG. 7, an embodiment of a display device DD may include a display panel DP, a scan driver SDV, a data driver DDV, a light emission driver EDV, and a plurality of pads PD.

In an embodiment, the display panel DP may have a rectangular shape having long edges extended in a first direction DR1 and short edges extended in a second direction DR2, but the shape of the display panel DP is not limited thereto. The display panel DP may include a display area DA and a non-display area NDA which surrounds the display area DA.

The display panel DP may include a plurality of pixels PX, a plurality of scan lines SL1-SLm, a plurality of data lines DL1-DLn, a plurality of light emitting lines EL1-ELm, first and second control lines CSL1 and CSL2, first and second power lines PL1 and PL2, and connection lines CNL. Here, m and n are natural numbers.

The pixels PX may be disposed on the display area DA. The scan driver SDV and the light emission driver EDV may be arranged in non-display areas NDA respectively adjacent to long edges of the display panel DP. The data driver DDV may be disposed in the non-display area NDA adjacent to any one of short edges of the display panel DP. When viewed from a plane, the data driver DDV may be adjacent to a lower end of the display panel DP.

The scan lines SL1-SLm may be extended in the second direction DR2 to be connected to the pixels PX and the scan driver SDV. The data lines DL1-DLn may be extended in the first direction DR1 to be connected to the pixels PX and the data driver DDV. The light emitting lines EL1-ELm may be extended in the second direction DR2 to be connected to the pixels PX and the light emission driver EDV.

The first power line PL1 may be extended in the first direction DR1 to be disposed in the non-display area NDA. The first power line PL1 may be disposed between the display area DA and the light emission driver EDV.

The connection lines CNL may be extended in the second direction DR2 and may be arranged in the first direction DR1 to be connected to the first power line PL1 and the pixels PX. A first voltage may be applied to the pixels PX through the first power line PL1 and the connection lines CNL, which are connected to each other. The connection lines CNL may be substantially defined as a portion of the first power line PL1 that receives the first voltage.

The second power line PL2 may be disposed in the non-display area NDA and may be extended along long edges of the display panel DP and another short edge of the display panel DP on which the data driver DDV is not disposed. The second power line PL2 may be disposed on a farther outline than the scan driver SDV and the light emission driver EDV.

Although not illustrated, the second power line PL2 may be extended toward the display area DA to be connected to the pixels PX. A second voltage having a level lower than the first voltage may be applied to the pixels PX through the second power line PL2.

The first control line CSL1 may be connected to the scan driver SDV to be extended toward a lower end of the display panel DP. The second control line CSL2 may be connected to the light emission driver EDV to be extended toward the lower end of the display panel DP. The data driver DDV may be disposed between the first control line CSL1 and the second control line CSL2.

The pads PD may be arranged in the non-display area NDA adjacent to the lower end of the display panel DP and may be more adjacent to the lower end of the display panel DP than the data driver DDV. The data driver DDV, the first and second power lines PL1 and PL2, and the first and second control lines CSL1 and CSL2 may be connected to the pads PD. The data lines DL1-DLn may be connected to the data driver DDV, and the data driver DDV may be connected to the pads PD corresponding to the data lines DL1-DLn.

Although not illustrated, the display device DD may further include a timing controller for controlling operations of the scan driver SDV, the data driver DDV, and the light emission driver EDV and a voltage generation unit for generating the first and second voltages. The timing controller and the voltage generation unit may be connected to the corresponding pads PD through a printed circuit board.

The scan driver SDV may generate a plurality of scan signals. The scan signals may be applied to the pixels PX through the scan lines SL1-SLm. The data driver DDV may generate a plurality of data voltages. The data voltages may be applied to the pixels PX through the data lines DL1-DLn. The light emission driver EDV may generate a plurality of light emitting signals. The plurality of light emitting signals may be applied to the pixels PX through the light emitting lines EL1-ELm.

The pixels PX may receive data voltages in response to scan signals. The pixels PX may emit a light of luminance corresponding to data voltages in response to light emitting signals to display an image.

Figure 8:
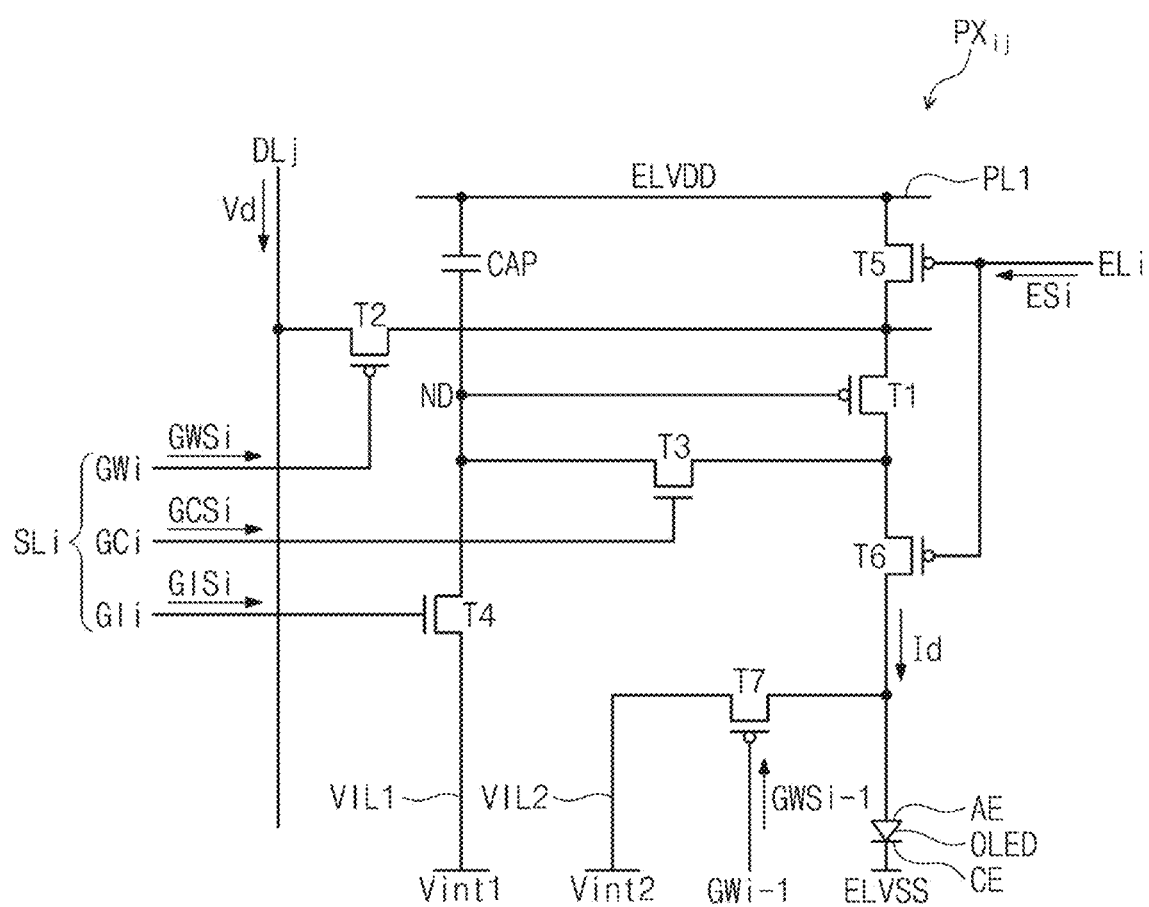
FIG. 8 is a drawing illustrating an equivalent circuit of an embodiment of one pixel shown in FIG. 7.
Figure 9:
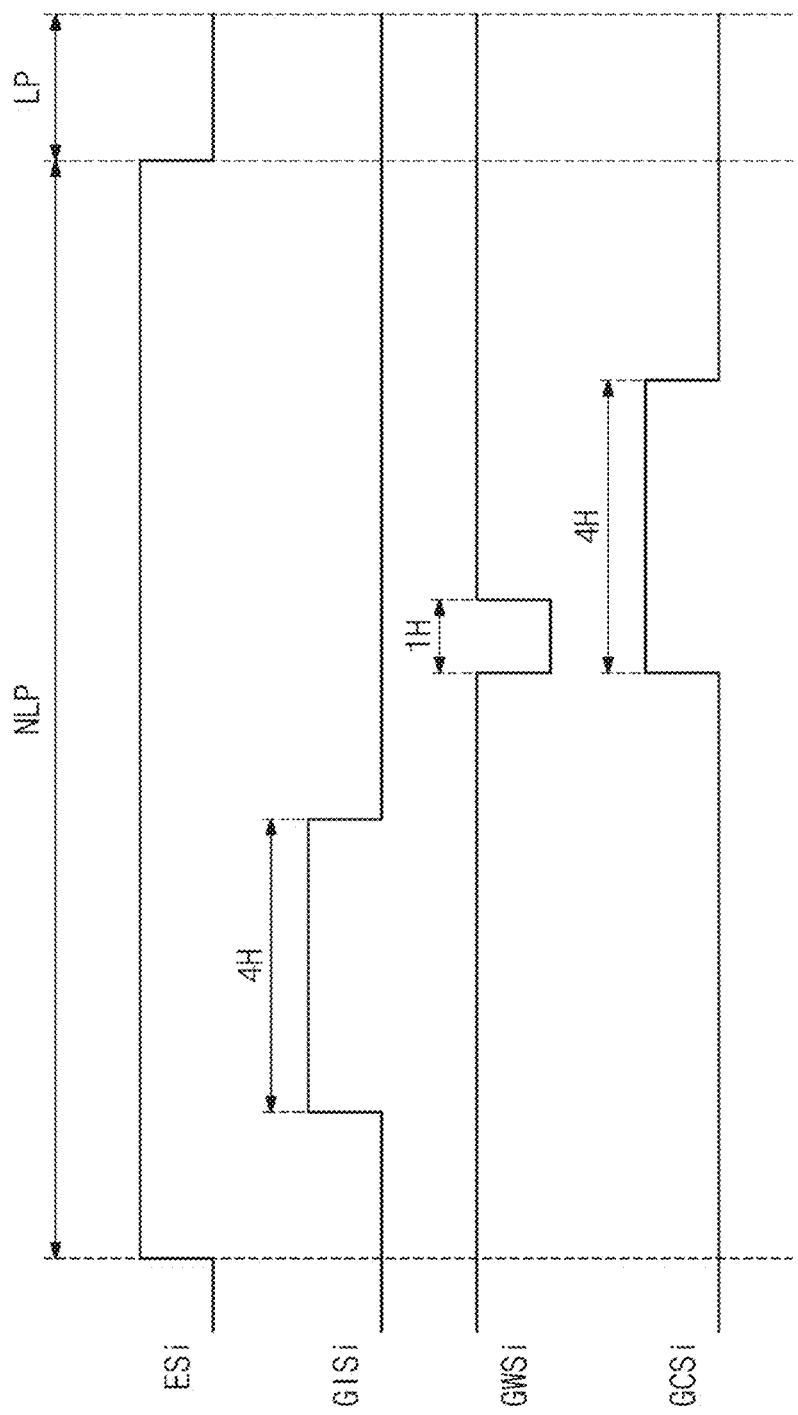
FIG. 9 is a timing diagram of signals for driving a pixel shown in FIG. 8.

FIG. 8 is a drawing illustrating an equivalent circuit of an embodiment of one pixel shown in FIG. 7. FIG. 9 is a timing diagram of signals for driving a pixel shown in FIG. 8.

FIG. 8 illustrates an embodiment of a pixel PXij connected to an i-th scan line SLi, an i-th light emitting line ELi, and a j-th data line DLj. Here, i and j are natural numbers.

Referring to FIG. 8, in an embodiment, the pixel PXij may include a light emitting element OLED, a plurality of transistors T1-T7, and a capacitor CAP.

The transistors T1-T7 and the capacitor CAP may control the amount of flow which flows in the light emitting element OLED. The light emitting element OLED may generate light having certain luminance corresponding to the provided amount of current.

The i-th scan line SLi may include an i-th write scan line GWi, an i-th compensation scan line GCi, and an i-th initialization scan line GIi. The i-th write scan line GWi may receive an i-th write scan signal GWSi, the i-th compensation scan line GCi may receive an i-th compensation scan signal GCSi, and the i-th initialization scan line GIi may receive an i-th initialization scan signal GISi.

Each of the transistors T1-T7 may include a source electrode, a drain electrode, and a gate electrode. Hereinafter, for convenience of description, in FIG. 8, one of the source electrode and the drain electrode is referred to as a first electrode, and the other of the source electrode and the drain electrode is referred to as a second electrode. Furthermore, the gate electrode is referred to as a control electrode.

The transistors T1-T7 may include the first to sixth transistors T1 to T7. The first, second, fifth, sixth, and seventh transistors T1, T2, T5, T6, and T7 may include P-channel metal-oxide-semiconductor ("PMOS") transistors. The third and fourth transistors T3 and T4 may include N-channel metal-oxide-semiconductor ("NMOS") transistors.

The first transistor T1 may be defined as a driving transistor, and the second transistor T2 may be defined as a switching transistor. The third transistor T3 may be defined as a compensation transistor.

The fourth transistor T4 and the seventh transistor T7 may be defined as initialization transistors. The fifth transistor T5 and the sixth transistor T6 may be defined as light emitting control transistors.

The light emitting element OLED may be defined as an organic light emitting element. The light emitting element OLED may include an anode AE and a cathode CE. The anode AE may receive a first voltage ELVDD via the sixth, first, fifth transistors T6, T1, and T5. The cathode CE may receive a second voltage ELVSS.

The first transistor T1 may be connected between the anode AE of the light emitting element OLED and the first power line PL1 that receives the first voltage ELVDD and may be switched by a voltage of a node ND. In an embodiment, the first transistor T1 may be connected between the fifth transistor T5 and the sixth transistor T6. The first transistor T1 may receive the first voltage ELVDD via the fifth transistor T5 and may be connected to the anode AE via the sixth transistor T6.

The first transistor T1 includes a first electrode that receives the first voltage ELVDD via the fifth transistor T5, a second electrode connected to the anode AE via the sixth transistor T6, and a control electrode connected to the node ND.

The first transistor T1 may include a first electrode connected to the fifth transistor T5, a second electrode connected to the sixth transistor T6, and a control electrode connected to the node ND. The first transistor T1 may control the amount of current which flows in the light emitting element OLED based on a voltage of the node ND, which is applied to the control electrode of the first transistor T1.

The second transistor T2 may be connected between the first transistor T1 connected to the first power line PL1 and the data line DLj and may be switched by the write scan signal GWSi. In an embodiment, the second transistor T2 may be connected to the first power line PL1 via the fifth transistor T5. The second transistor T2 is connected between the data line DLj and the first electrode of the first transistor T1.

The second transistor T2 may include a first electrode connected to the data line DLj, a second electrode connected to the first electrode of the first transistor T1, and a control electrode connected to the i-th write scan line GWi.

The second transistor T2 may be turned on by the i-th write scan signal GWSi applied through the i-th write scan line GWi to electrically connect the data line DLj and the first electrode of the first transistor T1. The second transistor T2 may perform a switching operation for supplying a data voltage Vd supplied through the data line DLj to the first electrode of the first transistor T1.

The third transistor T3 may be connected between the node ND and the anode AE of the light emitting element OLED and may be switched by the compensation scan signal GCSi. In an embodiment, the third transistor T3 may be connected to the anode AE via the sixth transistor T6. The third transistor T3 is connected between the second electrode of the first transistor T1 and the node ND.

The third transistor T3 may include a first electrode connected to the second electrode of the first transistor T1, a second electrode connected to the node ND, and a control electrode connected to the i-th compensation scan line GCi.

The third transistor T3 may be turned on by the i-th compensation scan signal GCSi applied through the i-th compensation scan line GCi to electrically connect the second electrode of the first transistor T1 and the control electrode of the first transistor T1. When the third transistor T3 is turned on, the first transistor T1 and the third transistor T3 may be connected to each other in the form of a diode.

The fourth transistor T4 may be connected between the node ND and the first initialization line VIL1 and may be switched by the i-th initialization scan signal GISi. The fourth transistor T4 may include a first electrode connected to the node ND, a second electrode connected to the first initialization line VIL1, and a control electrode connected to the i-th initialization scan line Gli.

The fourth transistor T4 may be turned on by the i-th initialization scan signal GISi applied through the i-th initialization scan line Gli to provide the node ND with a first initialization voltage Vint1 supplied through the first initialization line VIL1.

The fifth transistor T5 may be connected between the first voltage line PL1 and the first transistor T1. The fifth transistor T5 may include a first electrode that receives the first voltage ELVDD, a second electrode connected to the first electrode of the first transistor T1, and a control electrode connected to the i-th light emitting line ELi.

The sixth transistor T6 is connected between the first transistor T1 and the anode AE. The sixth transistor T6 may include a first electrode connected to the second electrode of the first transistor T1, a second electrode connected to the anode AE, and a control electrode connected to the i-th light emitting line ELi.

The fifth transistor T5 and the sixth transistor T6 may be turned on by the i-th light emitting signal ESi applied through the i-th light emitting line ELi. The first voltage ELVDD may be supplied to the light emitting element OLED by the fifth transistor T5 and the sixth transistor T6, which are turned on, such that driving current may flow in the light emitting element OLED. Thus, the light emitting element OLED may emit light.

The seventh transistor T7 may include a first electrode connected to the anode AE, a second electrode connected to a second initialization line VIL2, and a control electrode connected to an (i–1)-th write scan line GWi-1. The (i–1)-th write scan line GWi-1 may be defined as a write scan line of a stage before the i-th write scan line GWi.

The seventh transistor T7 may be turned on by the (i–1)-th write scan signal GWSi-1 applied through the (i–1)-th write scan line GWi-1 to supply the second initialization voltage Vint2 received through the second initialization line VIL2 to the anode AE of the light emitting element OLED.

In an alternatively embodiment of the disclosure, the seventh T7 may be omitted. In an embodiment of the disclosure, the second initialization voltage Vint2 may have, but is not limited to, a same level as the first initialization voltage Vint1, and may have a level different from the first initialization voltage Vint1.

The seventh transistor T7 may improve black expression ability of the pixel PX. When the seventh transistor T7 is turned on, a parasitic capacitor (not shown) of the light emitting element OLED is discharged. Thus, when black luminance is implemented, the light emitting element OLED may not emit light due to a leakage current of the first transistor T1, thus improving black expression ability.

The capacitor CAP may include a first electrode that receives the first voltage ELVDD and a second electrode connected to the node ND. When the fifth transistor T5 and the sixth transistor T6 are turned on, an amount of current which flows in the first transistor T1 may be determined according to voltage stored in the capacitor CAP.

Hereinafter, the operation of the pixel PXij will be described in detail with reference to the timing diagram of FIG. 9.

Referring to FIGS. 8 and 9, an i-th light emitting signal ESi may have a high level during a non-light emitting period NLP and may have a low level during a light emitting period LP.

An activation interval of an i-th write scan signal GWSi may be defined as a low level of the i-th write scan signal GWSi. An activation interval of each of an i-th compensation scan signal GCSi and an i-th initialization scan signal GISi may be defined as a high level of each of the i-th compensation scan signal GCSi and the i-th initialization scan signal GISi.

In an embodiment, an activation interval 4H of the i-th initialization scan signal GISi and an activation interval 4H of the i-th compensation scan signal GCSi may be four times an activation interval 1H of the i-th write scan signal GWSi.

After the i-th initialization scan signal GISi is activated, the i-th write scan signal GWSi and the i-th compensation scan signal GCSi may be activated. During the light emitting period LP, the i-th initialization scan signal GISi, the i-th write scan signal GWSi, and the i-th compensation scan signal GCSi, which are each activated, may be applied to a pixel PXij.

Hereinafter, an operation applied to a transistor corresponding to each signal may indicate an operation where an activated signal is applied to the transistor.

As the i-th initialization scan signal GISi is applied to the fourth transistor T4, the fourth transistor T4 may be turned on. The first initialization voltage Vint1 may be supplied to the node ND via the fourth transistor T4. Thus, as the first initialization voltage Vint1 is supplied to the control electrode of the first transistor T1, the first transistor T1 may be initialized by the first initialization voltage Vint1.

Although not illustrated in the timing diagram of FIG. 9, as the (i−1)-th write scan signal GWSi-1 activated earlier than the i-th write scan signal GWSi is applied to the control electrode of the seventh transistor T7, the seventh transistor T7 may be turned on. As the second initialization voltage Vint2 is supplied to the anode AE via the seventh transistor T7, the anode AE may be initialized to the second initialization voltage Vint2.

Thereafter, as the i-th write scan signal GWSi is applied to the second transistor T2, the second transistor T2 may be turned on. Furthermore, as the i-th compensation scan signal GCSi is applied to the third transistor T3, the third transistor T3 may be turned on.

Thus, the first transistor T1 and the third transistor T3 may be connected to each other in the form of a diode. In this case, a compensation voltage (Vd-Vth) reduced from the data voltage Vd supplied through the data line DLj by a threshold voltage (Vth) of the first transistor T1 may be applied to the control electrode of the first transistor T1.

The first voltage ELVDD and the compensation voltage (Vd-Vth) may be applied to the first electrode and the second electrode of the capacitor CAP, respectively. A charge corresponding to a difference between a voltage of the first electrode of the capacitor CAP and a voltage of the second electrode of the capacitor CAP may be stored in the capacitor CAP.

Thereafter, as the i-th light emitting signal ESi is applied to the fifth transistor T5 and the sixth transistor T6 through the i-th light emitting line ELi during a light emitting period LP, the fifth transistor T5 and the sixth transistor T6 may be turned on. In this case, a driving current Id corresponding to a voltage difference between a voltage of the control electrode of the first transistor T1 and the first voltage ELVDD. As the driving current Id is supplied to the light emitting element OLED via the sixth transistor T6, the light emitting element OLED may emit light.

A gate-source voltage Vgs of the first transistor T1 may be defined as a voltage difference between the first voltage ELVDD and the compensation voltage (Vd-Vth) as in Equation 1 below by the capacitor CAP during the light emitting period LP.

$$Vgs = ELVDD - (Vd - Vth) \quad (1)$$

A relationship formula of a current and a voltage of the first transistor T1 is the following Equation 2. Equation 2 below is a relationship formula of a current and a voltage of a general transistor.

$$Id = (1/2)\mu Cox(W/L)(Vgs - Vth)^2 \quad (2)$$

When substituting Equation 1 into Equation 2, the threshold voltage (Vth) may be removed, and the driving current Id may be proportional to a value $(ELVDD-Vd)^2$ of the square of a value in which the data voltage Vd is subtracted from the first voltage ELVDD. Thus, the driving current Id may be determined regardless of the threshold voltage Vth of the first transistor T1. Such an operation may be defined as a threshold voltage compensation operation.

Figure 10:
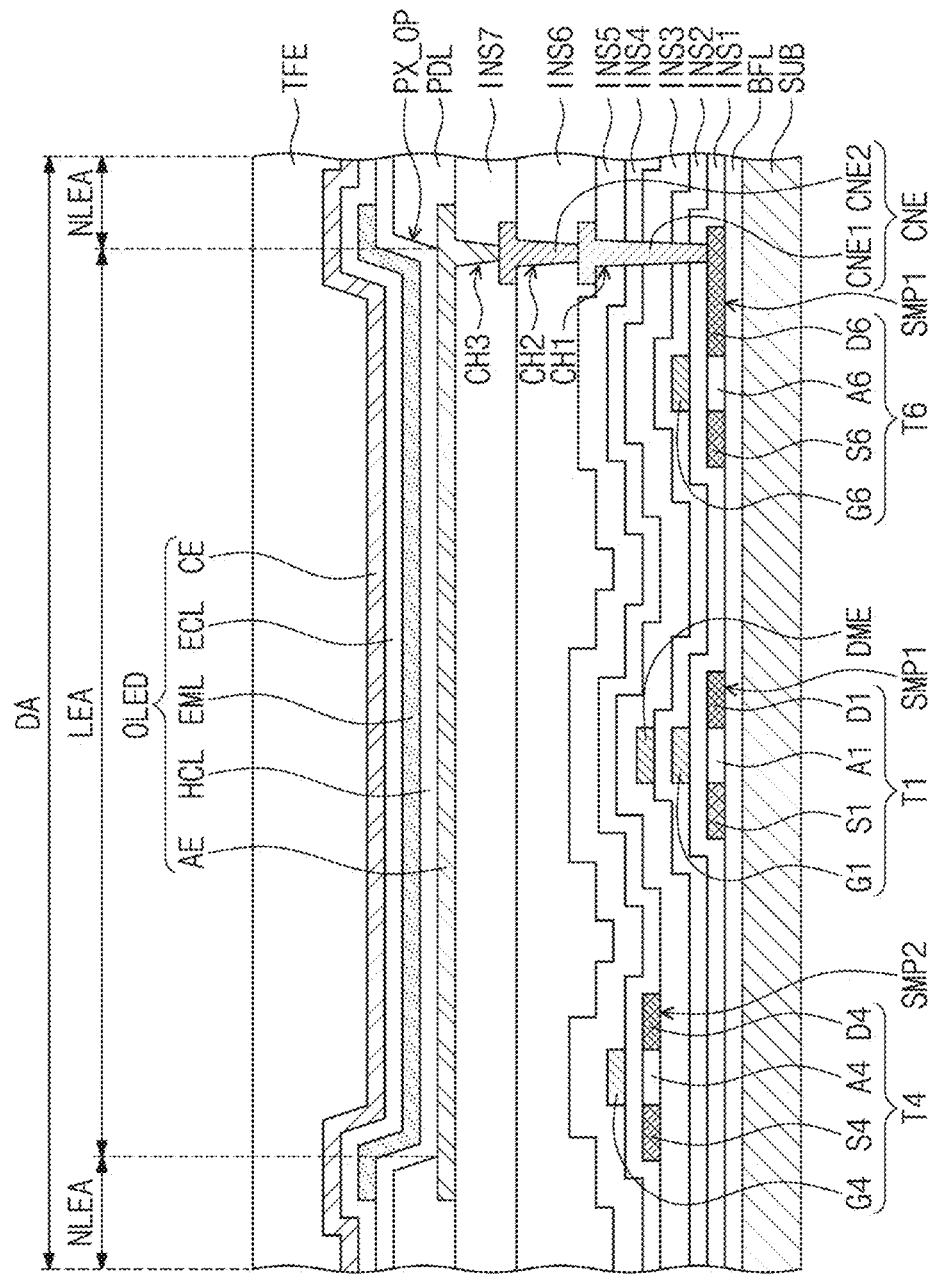
FIG. 10 is a drawing illustrating a cross section of a light emitting element, a first transistor, a fourth transistor, and a sixth transistor shown in FIG. 8.

FIG. 10 is a drawing illustrating a cross section of a light emitting element, a first transistor, a fourth transistor, and a sixth transistor shown in FIG. 8.

Referring to FIG. 10, in an embodiment, a light emitting element OELD may include a first electrode AE, a second electrode CE, a hole control layer HCL, an electronic control layer ECL, and a light emitting layer EML. The first electrode AE may be an anode AE shown in FIG. 8, and the second electrode CE may be a cathode CE shown in FIG. 8.

First, fourth, and sixth transistors T1, T4, and T6 and the light emitting element OLED may be arranged or disposed on a substrate SUB. A display area DA may include a light emitting area LEA corresponding to a pixel PXij and a non-light emitting area NLEA adjacent to the light emitting area LEA. The light emitting element OLED may be disposed on the light emitting area LEA.

A buffer layer BFL may be disposed on the substrate SUB, and the buffer layer BFL may be an inorganic layer. A first semiconductor pattern SMP1 of each of the first and sixth transistors T1 and T6 may be disposed on the buffer layer BFL. The first semiconductor pattern SMP1 may include polysilicon. However, the disclosure is not limited thereto, and alternatively, the first semiconductor pattern SMP1 may include amorphous silicon.

The first semiconductor pattern SMP1 may be doped with an N-type dopant or a P-type dopant. The first semiconductor pattern SMP1 may include a highly doped area and a low doped area. Conductivity of the highly doped area may be greater than that of the low doped area and may substantially function as or define a source electrode and a drain electrode of a transistor TR. The low doped area may substantially correspond to an active (or channel) of the transistor.

A source electrode S1, an active A1, and a drain electrode D1 of the first transistor T1 and a source electrode S6, an active A6, and a drain electrode D6 of the sixth transistor T6 may be formed from or defined by the first semiconductor pattern SMP1. The active A1 may be disposed between the source electrode S1 and the drain electrode D1. The active A6 may be disposed between the source electrode S6 and the drain electrode D6.

A first insulating layer INS1 may be disposed on the buffer layer BFL to cover the first semiconductor pattern SMP1. Gate electrodes G1 and G6 (or control electrodes) of the first and sixth transistors T1 and T6 may be arranged on a first insulating layer INS1.

Although not illustrated, structures of a source electrode, an active, a drain electrode, and a gate electrode of each of second, fifth, and seventh transistors T2, T5, and T7 may be the same as those of the first and sixth transistors T1 and T6.

A second insulating layer INS2 may be disposed on the first insulating layer INS1 to cover the gate electrodes G1 and G6. A dummy electrode DME may be disposed on the second insulating layer INS2. The dummy electrode DME may be disposed above the first and sixth transistors T1 and T6. The dummy electrode DME may form the above-mentioned capacitor CAP together with the gate electrode G1. A third insulating layer INS3 may be disposed on the second insulating layer INS2 to cover the dummy electrode DME.

A second semiconductor pattern SMP2 of a fourth transistor T4 may be disposed on the third insulating layer INS3. The second semiconductor pattern SMP2 may include an oxide semiconductor including or formed with a metallic oxide. The oxide semiconductor may include a crystalline or amorphous oxide semiconductor.

The second semiconductor pattern SMP2 may include a plurality of areas divided based on whether a metal oxide is reduced. An area where the metallic oxide is reduced (hereinafter, referred to as a "reduction area") is larger in conductivity than an area where the metallic oxide is not reduced (hereinafter, referred to as a "non-reduction area"). The reduction area may substantially function as or define a source electrode or a drain electrode of the transistor. The non-reduction area may substantially correspond to an active (or channel) of the transistor.

A source electrode S4, an active A4, and a drain electrode D4 of the fourth transistor T4 may be formed from or defined by the second semiconductor pattern SMP2. The active A4 may be disposed between the source electrode S4 and the drain electrode D4.

A fourth insulating layer INS4 may be disposed on the third insulating layer INS3 to cover the second semiconductor pattern SMP2. A gate electrodes G4 (or a control electrode) of the fourth transistor T4 may be disposed on the fourth insulating layer INS4. A fifth insulating layer INS5 may be disposed on the fourth insulating layer INS4 to cover the gate electrode G4. Although not illustrated, structures of a source electrode, an active, a drain electrode, and a gate electrode of the third transistor T3 may be substantially the same as those of the fourth transistor T4.

The buffer layer BFL and the first to fifth insulation layers INS1-INS5 may include inorganic layers. In an embodiment, the buffer layer BFL and the first insulating layer INS1 may include a silicon oxide layer, and the second insulating layer INS2 may include a silicon nitride layer. The third insulating layer INS3 may include different materials and may include a plurality of inorganic insulating layers which are laminated with or stacked on each other. In an embodiment, for example, the third insulating layer NIS3 may include a silicon nitride layer and a silicon oxide layer, which are laminated with each other.

The fourth insulating layer INS4 may include a silicon oxide layer. The fifth insulating layer INS5 may include different materials and may include a plurality of inorganic insulating layers which are laminated with each other. In an embodiment, for example, the fifth insulating layer NIS5 may include a silicon oxide layer and a silicon nitride layer, which are laminated with each other. Each of the third and fifth insulating layers INS3 and INS5 may be greater in thickness than each of the first, second, and fourth insulating layers INS1, INS2, and INS4.

A connection electrode CNE may be disposed between the sixth transistor T6 and the light emitting element OLED. The connection electrode CNE may electrically connect the sixth transistor T6 and the light emitting element OLED. The connection electrode CNE may include a first connection electrode CNE1 and a second connection electrode CNE2 disposed on the first connection electrode CNE1.

The first connection electrode CNE1 may be disposed on the sixth transistor T6 to be electrically connected to the sixth transistor T6. The second connection electrode CNE2 may be disposed between the first connection electrode CNE1 and the first electrode AE to be electrically connected to the first connection electrode CNE1 and the first electrode AE.

The first connection electrode CNE1 may be disposed on the fifth insulating layer INS5 to be connected to the drain electrode D6 through a first contact hole CH1 defined in the first to fifth insulating layers INS1-INS5. A sixth insulating layer INS6 may be disposed on the fifth insulating layer INS5 to cover the first connection electrode CNE1.

The second connection electrode CNE2 may be disposed on the sixth insulating layer INS6. The second connection electrode CNE2 may be connected to the first connection electrode CNE1 through a second contact hole CH2 defined in the sixth insulating layer INS6.

A seventh insulating layer INS7 may be disposed on the sixth insulating layer INS6 to cover the second connection electrode CNE2. The sixth and seventh insulating layers INS6 and INS7 may include an inorganic layer or an organic layer.

The first electrode AE may be disposed on the seventh insulating layer INS7. The first electrode AE may be electrically connected to the second connection electrode CNE2 through a third contact hole CH3 defined in the seventh insulating layer INS7. A pixel defining layer PDL exposing a certain portion of the first electrode AE may be disposed on the first electrode AE and the seventh insulating layer INS7. An opening part PX_OP for exposing the certain portion of the first electrode AE may be defined in the pixel defining layer PDL.

A hole control layer HCL may be disposed on the first electrode AE and the pixel defining layer PDL. The hole control layer HCL may be disposed in common on a light emitting area LEA and a non-light emitting area NLEA. The hole control layer HCL may include a hole transport layer and a hole injection layer.

The light emitting layer EML may be disposed on the hole control layer HCL. The light emitting layer EML may be disposed on an area corresponding to the opening part PX_OP. The light emitting layer EML may include an organic material and/or an inorganic material. The light emitting layer EML may generate light of a corresponding one of red, green, and blue colors.

The electronic control layer ECL may be disposed on the light emitting layer EML and the hole control layer HCL. The electronic control layer ECL may be disposed in common on the light emitting area LEA and the non-light emitting area NLEA. The electronic control layer ECL may include a hole transport layer and a hole injection layer. The second electrode CE may be disposed on the electronic control layer ECL. The second electrode CE may be disposed in common on pixels PX.

A thin film encapsulation layer TFE may be disposed on the light emitting element OLED. The thin film encapsulation layer TFE may include an inorganic layer, an organic layer, and an inorganic layer, which are sequentially laminated with each other. The inorganic layers may include an inorganic material and may protect pixels PX from moisture/oxygen. The organic layer may include an organic material and may protect pixels PX from foreign substances such as dust particles.

The first voltage ELVDD may be applied to the first electrode AE, and the second voltage ELVSS may be applied to the second electrode CE. As holes and electrons injected into the light emitting layer EML are combined with each other, exciton may be formed. As the exciton transitions to a ground state, the light emitting element OLED may emit light. As the light emitting element OLED emit light, an image may be displayed.

FIGS. 11A to 11G are drawings illustrating a planar structure of an embodiment of a pixel shown in FIG. 8.

Figure 11A:
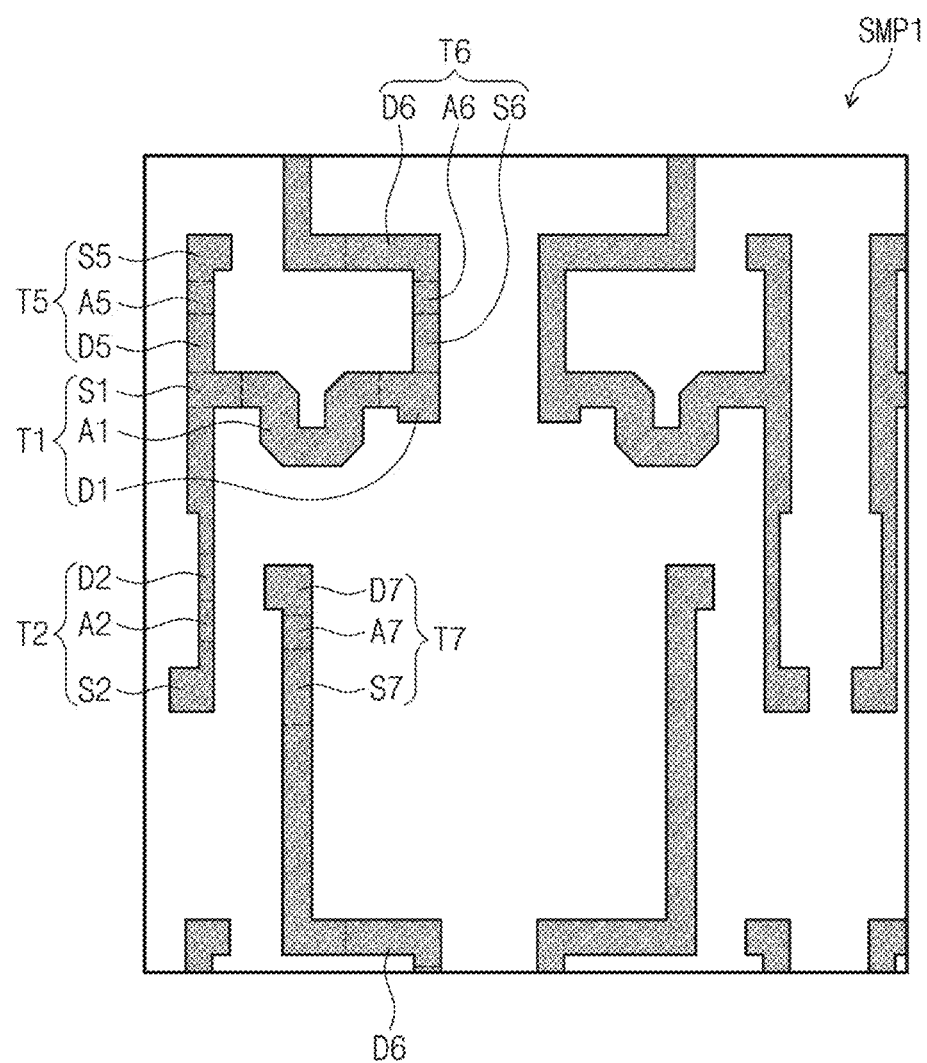
FIGS. 11A, 11B, 11C, 11D, 11E, 11F, and 11G are drawings illustrating a planar structure of an embodiment of a pixel shown in FIG. 8.
Figure 11B:
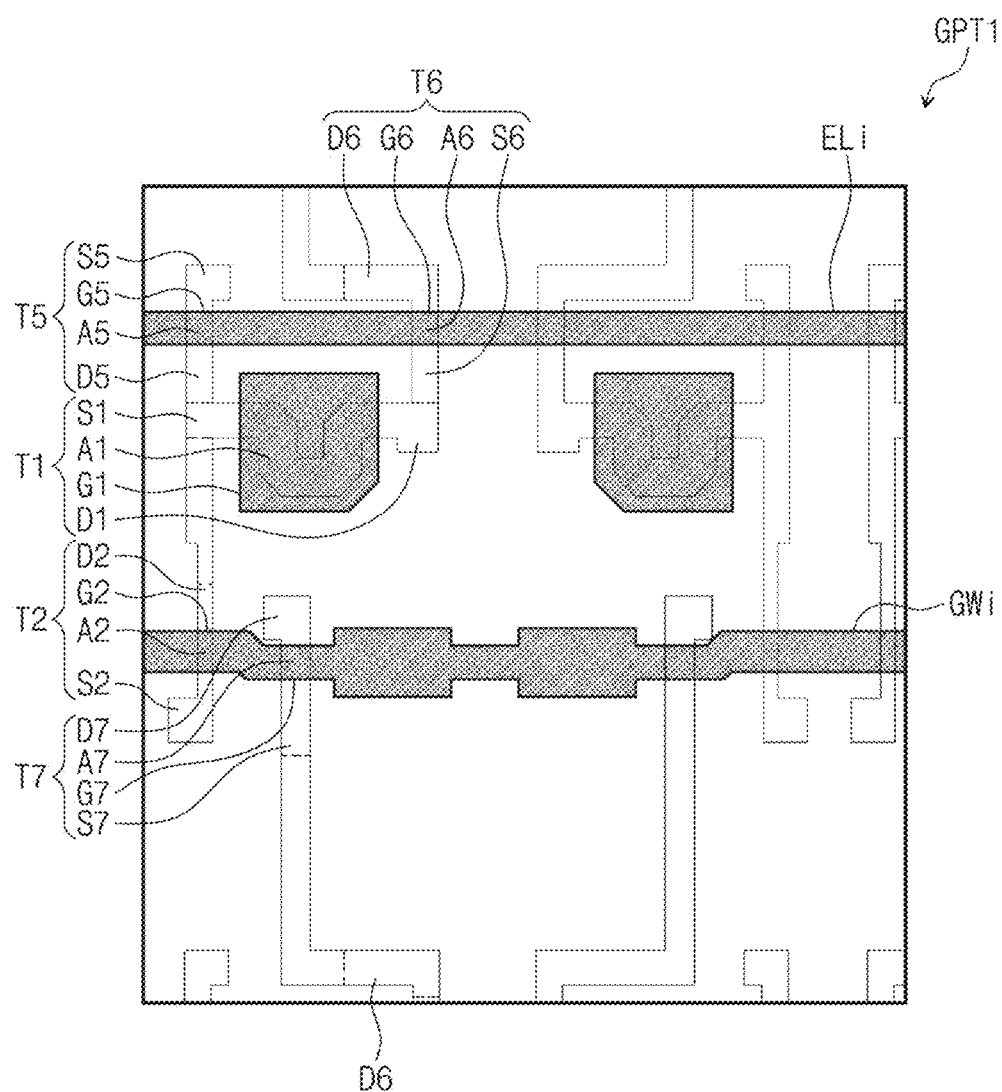
Figure 11C:
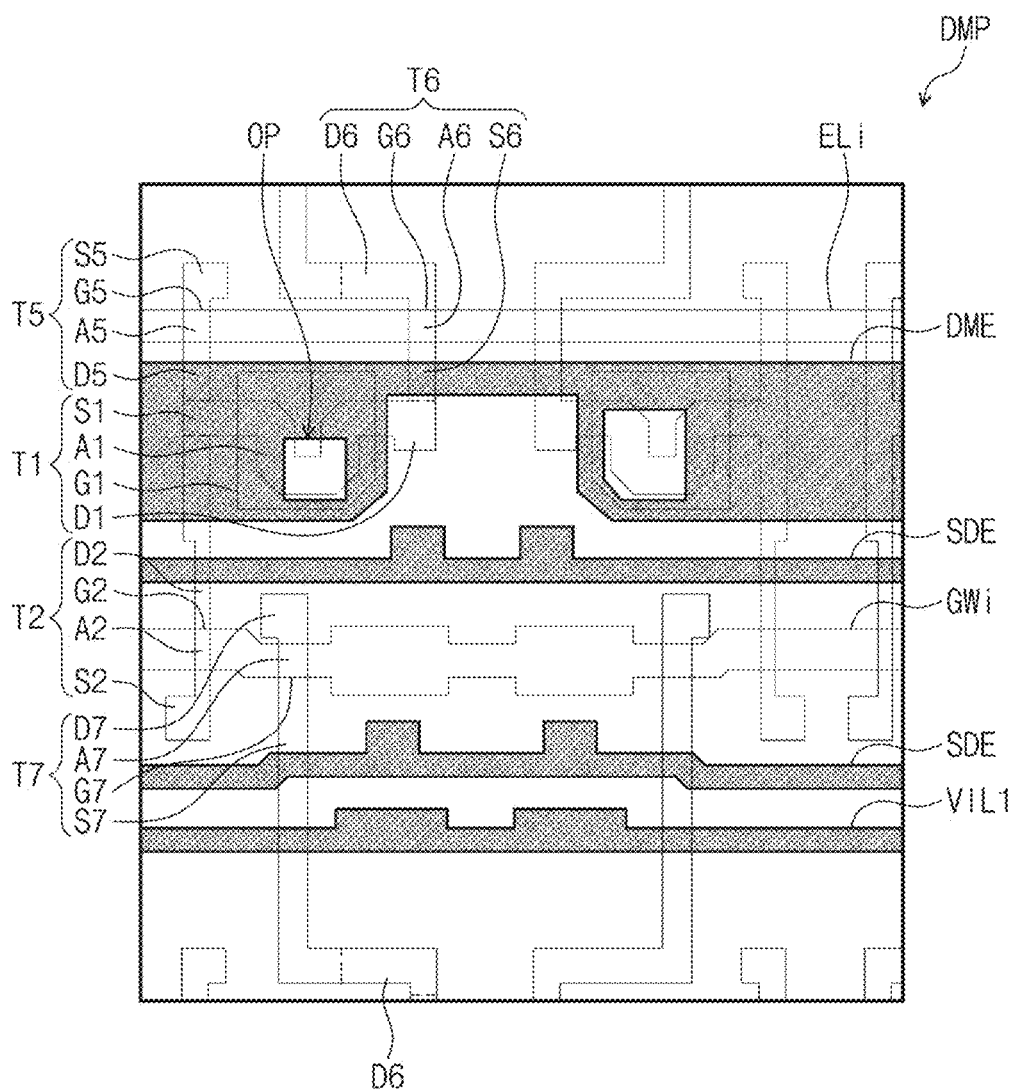
Figure 11D:
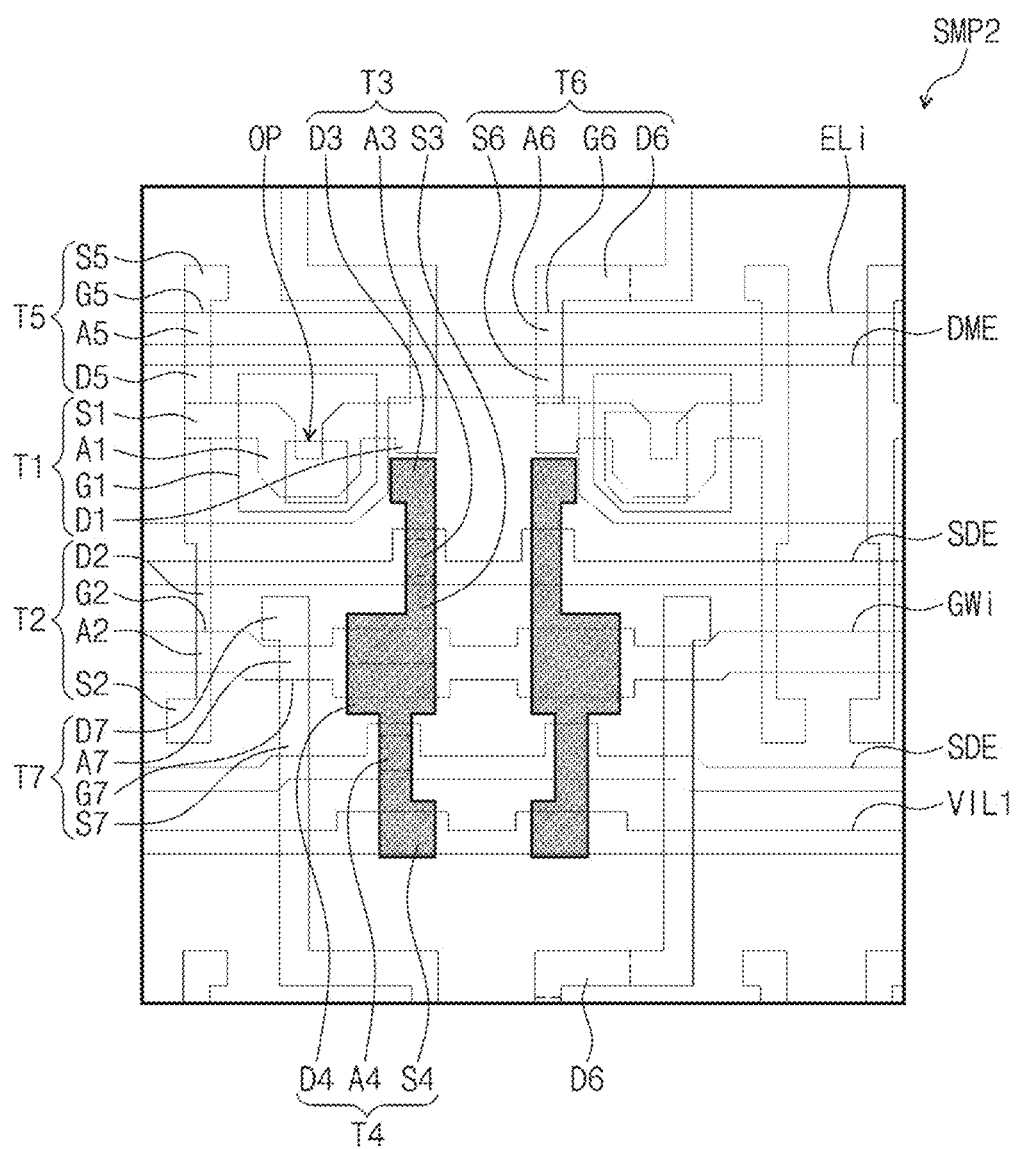
Figure 11E:
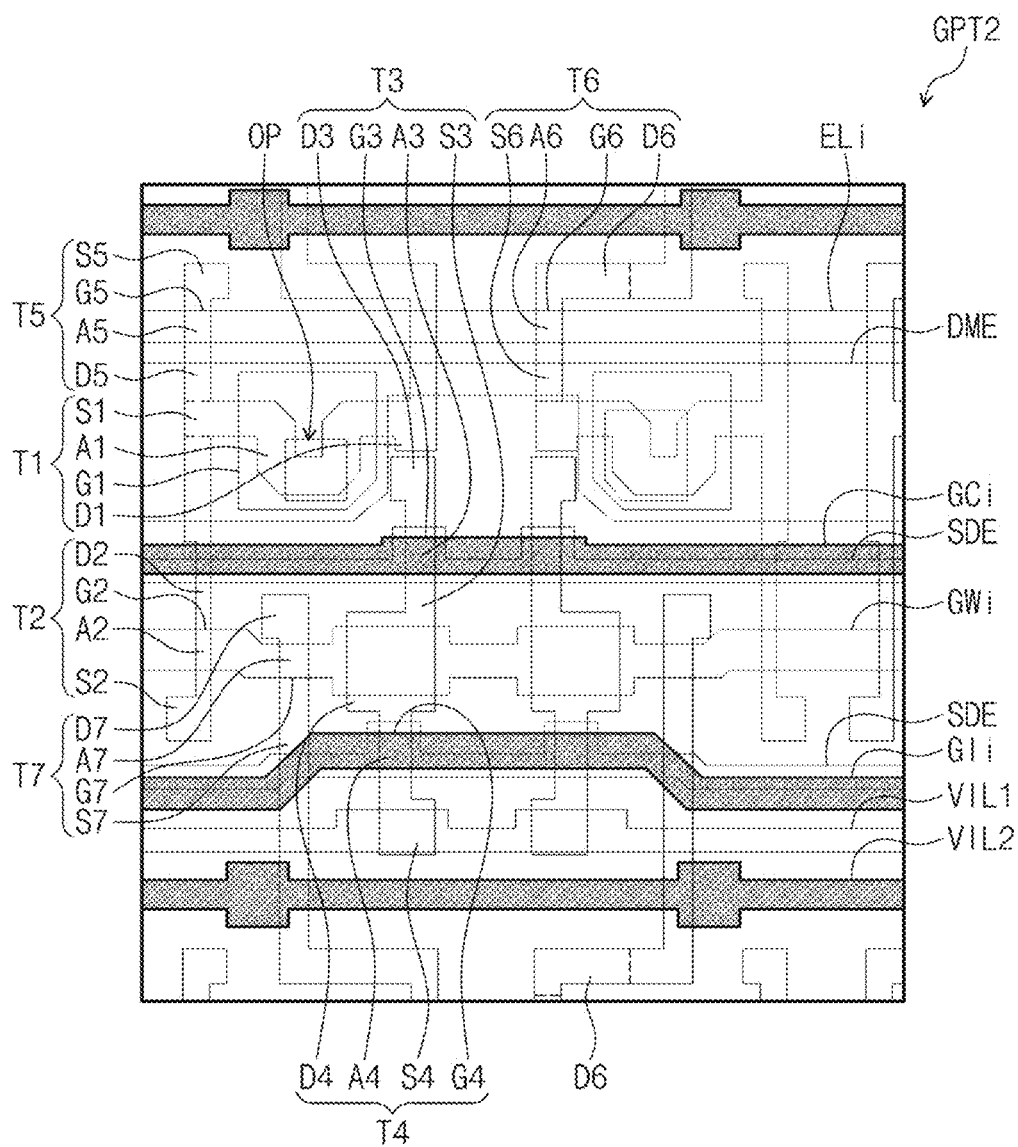
Figure 11F:
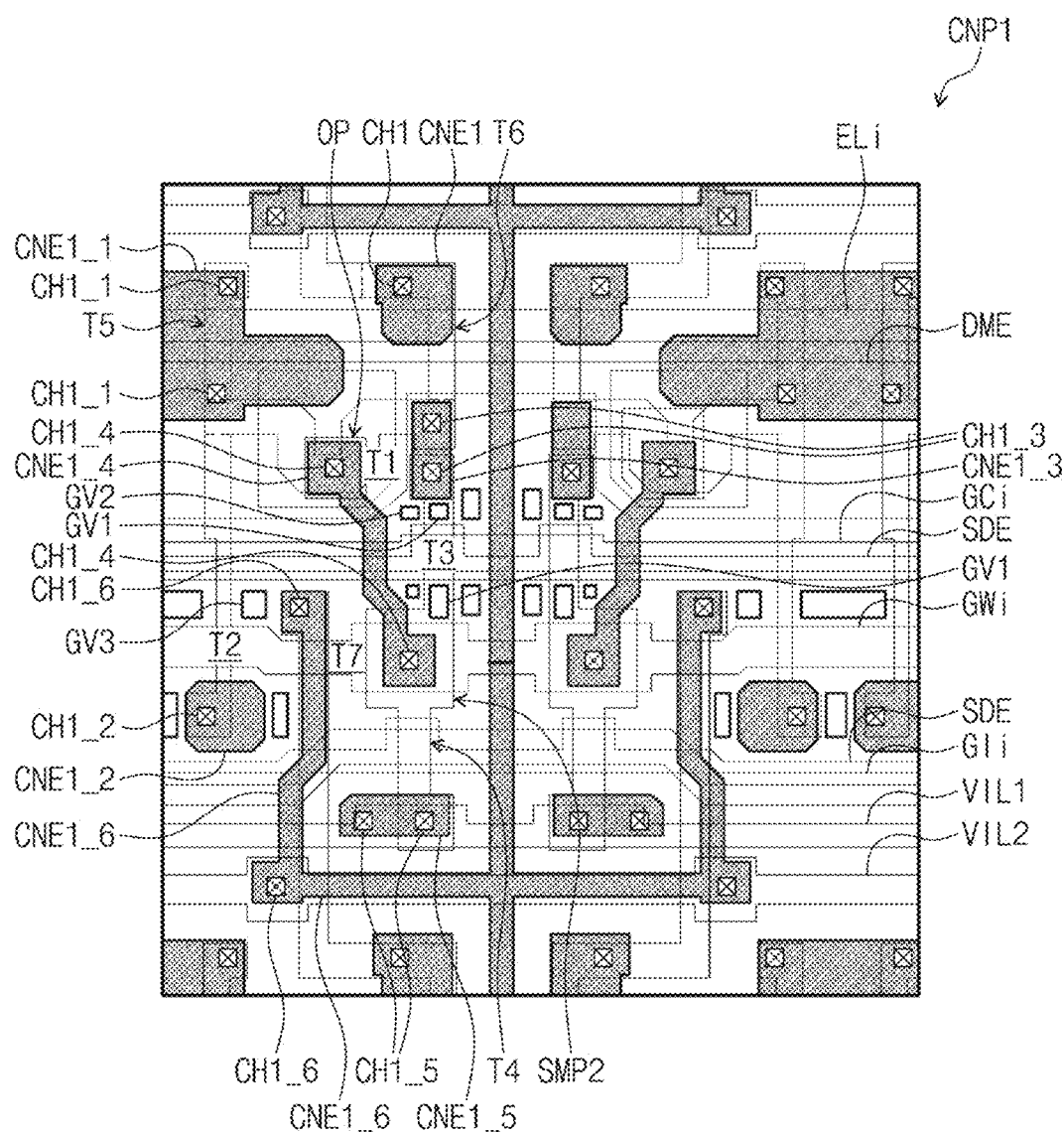
Figure 11G:
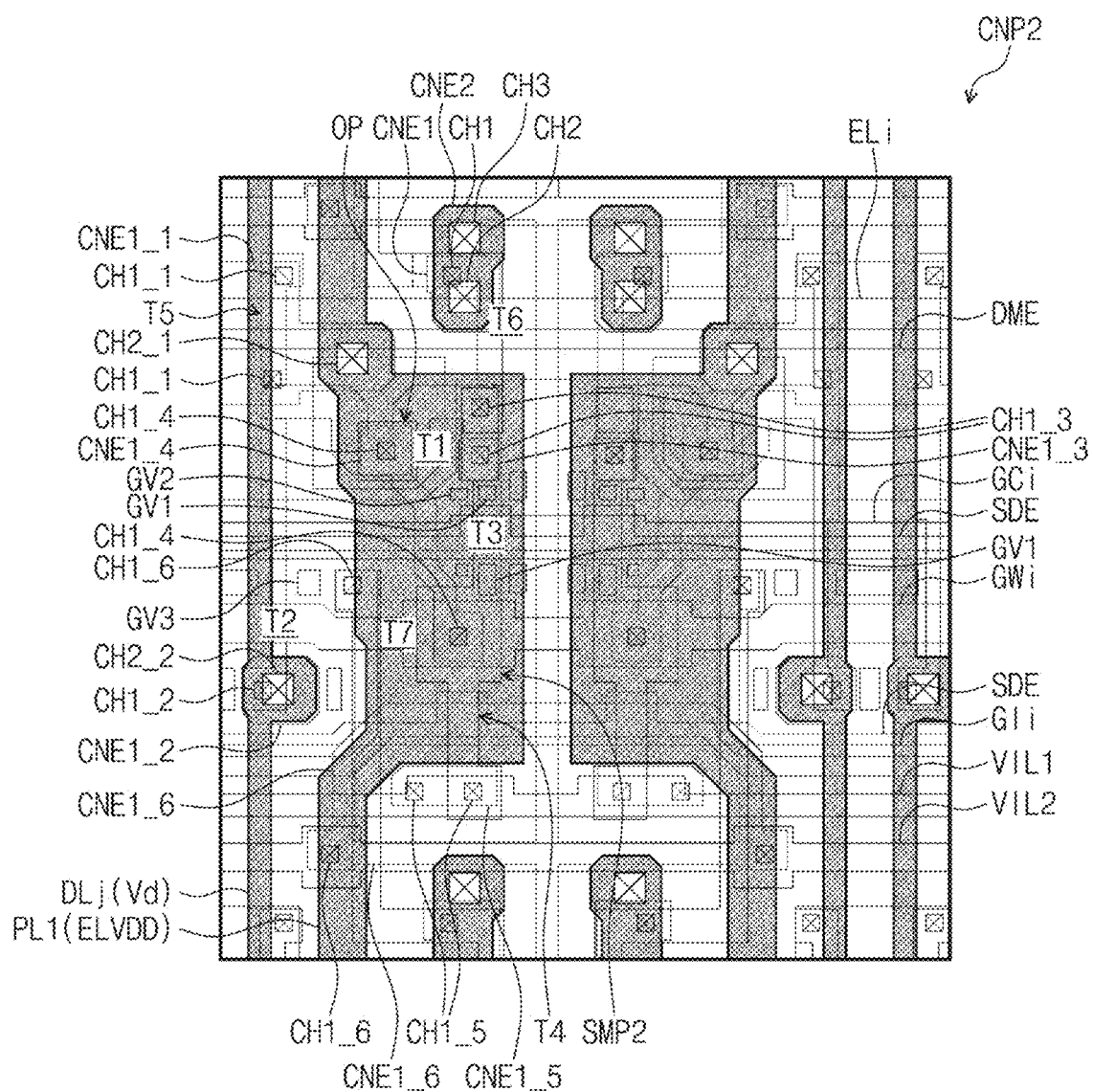

A plan view shown in FIG. 11G is a plan view of an embodiment of a PXij shown in FIG. 8. A sequentially laminated structure of patterns of the pixel PXij is illustrated in FIGS. 11A to 11G. The patterns of the pixel PXij may be defined as patterns for forming or defining source electrode S1-S7, drain electrodes D1-D7, actives A1-A7, gate electrodes G1-G7, a capacitor CAP, and first and second connection electrodes CNE1 and CNE2.

Hereinafter, the source electrode S1-S7, the drain electrodes D1-D7, the actives A1-A7, and the gate electrodes G1-G7 are defined as first to seventh source electrode S1-S7, first to seventh drain electrodes D1-D7, first to seventh actives A1-A7, and first to seventh gate electrodes G1-G7.

Hereinafter, for description, the laminated structure of patterns of the pixel PXij will be described in detail with reference to FIGS. 11A to 11G together with FIGS. 8 and 10.

Referring to FIGS. 8, 10, and 11A, a first semiconductor pattern SMP1 may be disposed on a substrate SUB. The first semiconductor pattern SMP1 is not limited to the shape shown in FIG. 11A, and may have various shapes.

First, second, fifth, sixth, and seventh source electrodes S1, S2, S5, S6, and S7, first, second, fifth, sixth, and seventh drain electrodes D1, D2, D5, D6, and D7, and first, second, fifth, sixth, and seventh actives A1, A2, A5, A6, and A7 of first, second, fifth, sixth, and seventh transistors T1, T2, T5, T6, and T7 may be formed or defined by the first semiconductor pattern SMP1.

The first, second, fifth, sixth, and seventh actives A1, A2, A5, A6, and A7 may be arranged between the first, second, fifth, sixth, and seventh source electrodes S1, S2, S5, S6, and S7 and the first, second, fifth, sixth, and seventh drain electrodes D1, D2, D5, D6, and D7, respectively.

The second drain electrode D2 of the second transistor T2 and the fifth drain electrode D5 of the fifth transistor T5 may be extended and formed from (or defined by an extended portion of) the first source electrode S1 of the first transistor T1. The sixth source electrode S6 of the sixth transistor T6 may be extended and formed from the first drain electrode D1 of the first transistor T1. The seventh source electrode S7 of the seventh transistor T7 may be extended and formed from the sixth drain electrode D6 of the sixth transistor T6.

According to such a structure, the first transistor T1 may be connected to the second, fifth, and sixth transistors T2, T5, and T6, and the sixth transistor T6 may be connected to the seventh transistor T7.

Referring to FIGS. 8, 10, and 11B, a first gate pattern GPT1 may be disposed on the first semiconductor pattern SMP1. The first gate pattern GPT1 may include a first gate electrode G1, a light emitting line ELi, and a write scan line GWi. The light emitting line ELi and the write scan line GWi may be extended in a horizontal direction. The first gate electrode G1, the light emitting line ELi, and the write scan line GWi may be spaced apart from each other in a vertical direction.

The gate electrode G1 of the first transistor T1 may be formed or defined by the first gate pattern GPT1. The first gate electrode G1 may be disposed to overlap the first active A1.

The light emitting line ELi may be extended to intersect the first semiconductor pattern SMP1. A fifth gate electrode G5 of the fifth transistor T5 and a sixth gate electrode G6 of the sixth transistor T6 may be formed or defined by the light emitting line ELi.

When viewed from a plane, portions of the light emitting line ELi overlapping the first semiconductor pattern SMP1 may be defined as the fifth and sixth gate electrodes G5 and G6. When viewed from a plane, the fifth gate electrode G5 may be overlapped with the fifth active A5, and the sixth gate electrode G6 may overlap the sixth active A6.

The write scan line GWi may be extended to intersect the first semiconductor pattern SMP1. A second gate electrode G2 of the second transistor T2 and a seventh gate electrode G7 of the seventh transistor T7 may be formed or defined by the write scan line GWi.

When viewed from a plane, portions of the write scan line GWi overlapped with the first semiconductor pattern SMP1 may be defined as the second and seventh gate electrodes G2 and G7. When viewed from a plane, the second gate electrode G2 may overlap the second active A2, and the seventh gate electrode G7 may overlap the seventh active A7.

The seventh transistor T7 shown in FIG. 11B may be the seventh transistor T7 of a next stage pixel. The seventh transistor T7 of the next stage pixel may be connected to the write scan line GWi of a current stage pixel.

Referring to FIGS. 8, 10, and 11C, a dummy pattern DMP may be disposed on the first gate pattern GPT1. The dummy pattern DMP may be extended in a horizontal direction and may include a dummy electrode DME, sub-dummy electrodes SDE, and a first initialization line VIL1, which are spaced apart from each other in a vertical direction.

When viewed from a plane, the dummy electrode DME may be partially overlapped with the first gate electrode G1. An opening part OP may be defined in the dummy electrode DME. The above-mentioned capacitor CAP may be formed by the dummy electrode DME and the first gate electrode G1, which overlap each other.

The sub-dummy electrodes SDE may be a compensation scan line GCi and an initialization scan line GIi, which will be described in FIG. 10E below, respectively. The first initialization voltage line VIL1 may be connected to the fourth transistor T4. Such a structure will be described with reference to FIG. 11F below.

Referring to FIGS. 8, 10, and 11D, a second semiconductor pattern SMP2 extended in a vertical direction may be disposed on the dummy pattern DMP. Third and fourth source electrodes S3 and S4, third and fourth drain electrodes D3 and D4, and third and fourth actives A3 and A4 of the third and fourth transistors T3 and T4 may be formed or defined by the second semiconductor pattern SMP2.

The third and fourth actives A3 and A4 may be arranged between the third and fourth source electrodes S3 and S4 and the third and fourth drain electrodes D3 and D4, respectively. The fourth drain electrode D4 of the fourth transistor T4 may be extended and formed from the third source electrode S3 of the third transistor T3. According to such a structure, the fourth transistor T4 may be connected to the third transistor T3.

Referring to FIGS. 8, 10, and 11E, a second gate pattern GP2 may be disposed on the second semiconductor pattern SMP2. The second gate pattern GPT2 may be extended in a horizontal direction and may include a compensation scan line GCi, an initialization scan line GE, and a second initialization line VIL2, which are spaced apart from each other in a vertical direction. A third gate electrode G3 of the third transistor T3 and a fourth gate electrode G4 of the fourth transistor T4 may be formed or defined by the second gate pattern GPT2.

The compensation scan line GCi may be extended to intersect the second semiconductor pattern SMP2. The third gate electrode G3 of the third transistor T3 may be formed or defined by the compensation scan line GCi. When viewed from a plane, a portion of the compensation scan line GCi overlapping the second semiconductor pattern SMP2 may be defined as the third gate electrodes G3. When viewed from a plane, the gate electrode G3 may overlap the third active A3.

The initialization scan line Gli may be extended to intersect the second semiconductor pattern SMP2. The fourth gate electrode G4 of the fourth transistor T4 may be formed or defined by the initialization scan line Gli. When viewed from a plane, a portion of the initialization scan line Gli overlapping the second semiconductor pattern SMP2 may be defined as the fourth gate electrodes G4. When viewed from a plane, the fourth gate electrode G4 may overlap the fourth active A4.

One sub-dummy electrode SDE may overlap the compensation scan line GCi, and the other sub-dummy electrode SDE may overlap the initialization scan line Gli. The second initialization voltage line VIL2 may be connected to the seventh transistor T7. Such a structure will be described with reference to FIG. 10F below.

Hereinafter, in FIGS. 11F and 11G, for convenience of illustration, reference characters for the first to seventh source electrodes S1-S7, the first to seventh drain electrodes D1-D7, the first to seventh actives A1-A7, and the first to seventh gates G1-G7 are omitted, and reference characters for the first to seventh transistors T1-T7 are shown.

Referring to FIGS. 8, 10, and 11F, a first connection pattern CNP1 may be disposed on the second gate pattern GP2. The first connection pattern CNP1 may include a plurality of first connection electrodes CNE1 (CNE1_1-CNE1_6).

The first connection electrode CNE1 may be a first connection electrode CNE1 shown in FIG. 10. The connection electrodes CNE1_1-CNE1_6 may be arranged in or directly on a same layer as the first connection electrode CNE1. The connection electrodes CNE1_1-CNE1_6 may be simultaneously patterned and formed of a same material as the first connection electrode CNE1 shown in FIG. 10.

A plurality of first contact holes CH1 (CH1_1-CH1_6) may be defined. The first contact hole CH1 may be a contact hole CH1 shown in FIG. 10. The contact holes CH1_1-CH1_6 may be formed to be substantially the same as the first contact hole CH1 shown in FIG. 10.

The sixth transistor T6 may be electrically connected to the first connection electrode CNE1 through the first contact hole CH1.

The fifth transistor T5 and the dummy electrode DME may be electrically connected to the first connection electrode CNE1_1 through the first contact hole CH1_1. The first connection electrode CNE1_1 may be electrically connected to the first power line PL1 which will be shown in FIG. 11G below.

The second transistor T2 may be electrically connected to the first connection electrode CNE1_2 through the first contact hole CH1_2. The first connection electrode CNE1_2 may be electrically connected to the data line DLj which will be shown in FIG. 11G below.

The first connection electrode CNE1_3 may be electrically connected to the third transistor T3 and the first and sixth transistors T1 and T6 through the first contact hole CH1_3. The third transistor T3 may be electrically connected to the first and sixth transistors T1 and T6 by the first connection electrode CNE1_3.

The first connection electrode CNE1_4 may be electrically connected to the third and fourth transistors T3 and T4 and the first gate electrode G1 of the first transistor T1 through the first contact hole CH1_4. The third and fourth transistors T3 and T4 may be electrically connected to the first transistor T1 by the first connection electrode CNE1_4.

As an opening part OP is defined or formed in the dummy electrode DME, a portion of the first gate electrode G1 may be exposed. Because the first contact hole CH1_4 is defined or formed in the opening part OP, the first connection electrode CNE1_4 may be easily connected to the first gate electrode G1.

The first connection electrode CNE1_5 may be electrically connected to the fourth transistor T4 and the first initialization line VIL1 though the first contact hole CH1_5. The fourth transistor T4 may be electrically connected to the first initialization line VIL1 by the first connection electrode CNE1_5.

The first connection electrode CNE1_6 may be electrically connected to the seventh transistor T7 and the second initialization line VIL2 through the first contact hole CH1_6. The seventh transistor T7 may be electrically connected to the second initialization line VIL2 by the first connection electrode CNE1_6.

A plurality of first grooves GV1 and a plurality of second grooves GV2 may be defined in portions adjacent to the third transistor T3. The first grooves GV1 may be defined on the second semiconductor pattern SMP2. The second grooves GV2 may be defined in a portion where the second semiconductor pattern SMP2 is not disposed. A plurality of third grooves GV3 may be defined in a portion adjacent to the second transistor T2.

Referring to FIGS. 8, 10, and 11G, the second connection pattern CNP2 may be disposed on the first connection pattern CNP1. The second connection pattern CNP2 may include a second connection electrode CNE2, a first power line PL1, and a data line DLj.

The second connection electrode CNE2 may be a second connection electrode CNE2 shown in FIG. 10. The second connection electrode CNE2, the first power line PL1, and the data line DLj may be disposed in or directly on a same layer as each other. The second connection electrode CNE2, the first power line PL1, and the data line DLj may be simultaneously patterned and formed of a same material.

A plurality of second contact holes CH2 (CH2_1 and CH2_2) may be defined. The second contact hole CH2 may be a second contact hole CH2 shown in FIG. 10. The second contact holes CH2_1 and CH2_2 may be formed to be substantially the same as the second contact hole CH2.

The second connection electrode CNE2 may be electrically connected to the first connection electrode CNE1 through the second contact hole CH2. As shown in FIG. 10, the second connection electrode CNE2 may be electrically connected to the first electrode AE through the third contact hole CH3.

The first power line PL1 that receives the first voltage ELVDD may be electrically connected to the first connection electrode CNE1_1 through the second contact hole CH2_1. Thus, as shown in FIG. 8, the first power line PL1 may be electrically connected to the fifth transistor T5 and the capacitor CAP.

The data line DLj may be electrically connected to the first connection electrode CNE1_2 through the second contact hole CH2_2. Thus, as shown in FIG. 8, the data line DLj may be electrically connected to the second transistor T2.

Figure 12:
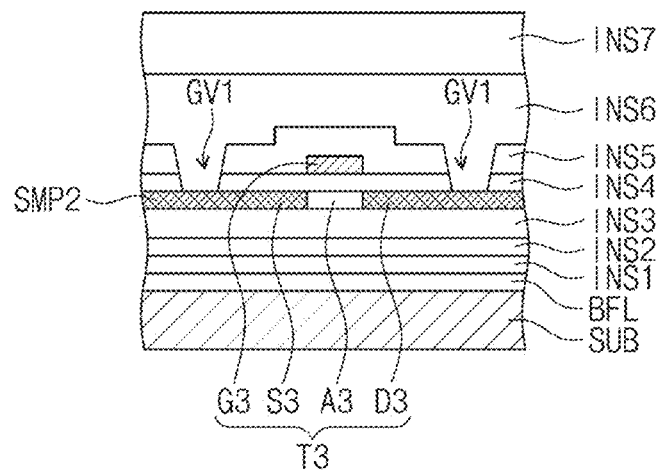
FIG. 12 is a drawing illustrating a cross section of first grooves shown in FIG. 11F.

FIG. 12 is a drawing illustrating a cross section of first grooves shown in FIG. 11F.

Particularly, a cross section from a substrate SUB to a seventh insulating layer INS7 is shown in FIG. 12.

Referring to FIG. 12, in an embodiment, an insulating layer INS may be disposed on the substrate SUB, and the insulating layer INS may cover a third transistor T3 over and under the third transistor T3. The insulating layer INS may be insulating layers BFL and INS1-INS7 shown in FIG. 10. In such an embodiment, the insulating layer INS may include the buffer layer BFL and the first to seventh insulating layers INS1-INS7 sequentially laminated on the buffer layer BFL. The third transistor T3 may be disposed on the third insulating layer INS3. The fifth insulating layer INS5 may be disposed on the third transistor T3.

The third transistor T3 may include a third source electrode S3, a third drain electrode D3, a third active A3 between the third source electrode S3 and the third drain electrode D3, and a third gate electrode G3 on the third active A3. The structure of the third transistor T3 may be substantially similar to a fourth transistor T4 shown in FIG. 10.

The third source electrode S3, the third active A3, and the third drain electrode D3 may be arranged on the third insulating layer INS3. A fourth insulating layer INS4 may be disposed on the third insulating layer INS3 to cover the third source electrode S3, the third active A3, and the third drain electrode D3. The third gate electrode G3 may be disposed on the fourth insulating layer INS4. The fifth insulating layer INS5 may be disposed on the fourth insulating layer INS4 to cover the third gate electrode G3.

First grooves GV1 may be defined in a portion of the insulating layer INS adjacent to the third transistor T3. The first grooves GV1 may be defined through portions of the fourth and fifth insulating layers INS4 and INS5, which overlap each other. The first grooves GV1 may be defined on a second semiconductor pattern SMP2 defining or forming the third source electrode S3 and the third drain electrode D3. Portions of the second semiconductor pattern SMP2 may be exposed by the first grooves GV1.

In an embodiment, the first grooves GV1 may be defined on the third source electrode S3 and the third drain electrode D3 to expose a portion of the third source electrode S3 and a portion of the third drain electrode D3. A sixth insulating layer INS6 may fill the first grooves GV1.

Figure 13:
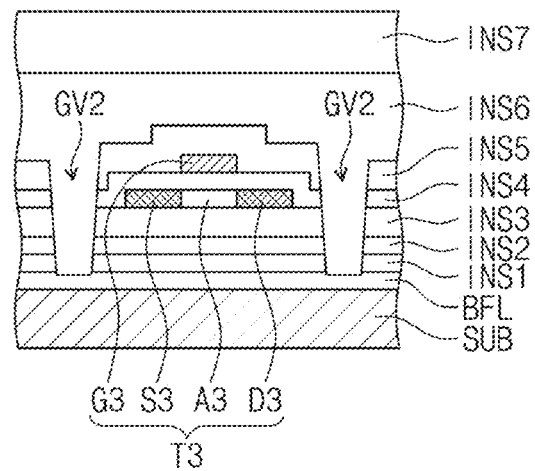
FIG. 13 is a drawing illustrating a cross section of second grooves shown in FIG. 11F.

FIG. 13 is a drawing illustrating a cross section of second grooves shown in FIG. 11F.

Particularly, a cross section from a substrate SUB to a seventh insulating layer INS7 is shown in FIG. 13. Hereinafter, second grooves will be described with reference to FIG. 13 together with FIG. 12.

Referring to FIGS. 12 and 13, second grooves GV2 may be defined in portions of the insulating layer INS adjacent to a third transistor T3. At least one first groove GV1 and at least one second groove GV2 may be different in depth from each other. In an embodiment, for example, each of the second grooves GV2 may be different in depth from each of the first grooves GV1. In an embodiment, the second grooves GV2 may be formed deeper than the first grooves GV1.

The second grooves GV2 may be defined through portions of first, second, third, fourth, and fifth insulating layers INS1, INS2, INS3, INS4 and INS5, which overlap each other. In such an embodiment, portions of an upper surface of a buffer layer BFL become concave by a certain depth, the second grooves GV2 may be further defined in the buffer layer BFL. The second grooves GV2 may not penetrate (or not be defined completely through) the buffer layer BFL. A sixth insulating layer INS6 may fill or disposed in the second grooves GV2.

Figure 14:
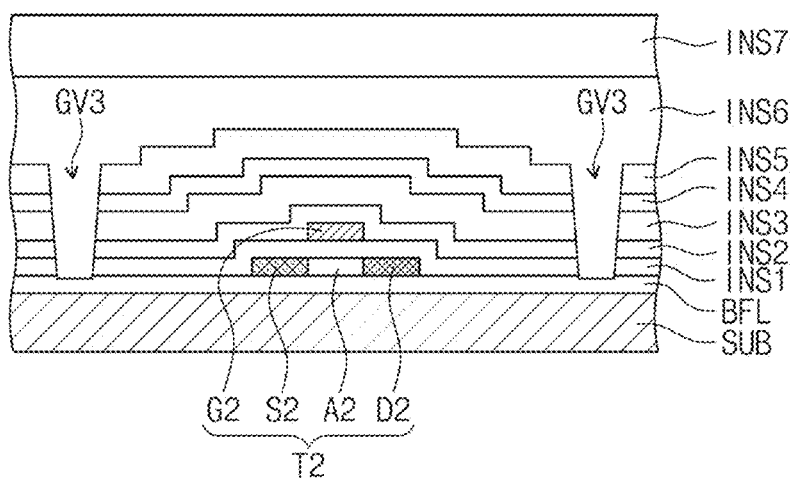
FIG. 14 is a drawing illustrating a cross section of third grooves shown in FIG. 11F.

FIG. 14 is a drawing illustrating a cross section of third grooves shown in FIG. 11F.

Particularly, a cross section from a substrate SUB to a seventh insulating layer INS7 is shown in FIG. 14.

Referring to FIG. 14, in an embodiment, an insulating layer INS may cover a second transistor T2 over and under the second transistor T2. The second transistor T2 may be disposed on a buffer layer BFL. A second insulating layer INS2 may be disposed on the second transistor T2.

The second transistor T2 may include a second source electrode S2, a second drain electrode D2, a second active A2 between the second source electrode S2 and the second drain electrode D2, and a second gate electrode G2 on the second active A2. The structure of the second transistor T2 may be substantially similar to a sixth transistor T6 shown in FIG. 10.

The second source electrode S2, the second drain electrode D2, and the second active A2 may be arranged on the buffer layer BFL. A first insulating layer INS1 may be disposed on the buffer layer BFL to cover the second source electrode S2, the second drain electrode D2, and the second active A2. The second gate electrode G2 may be disposed on the first insulating layer INS1. The second insulating layer INS2 may be disposed on the first insulating layer INS1 to cover the second gate electrode G2.

Third grooves GV3 may be defined in portions of the insulating layer INS adjacent to the second transistor T2. Each of the third grooves GV3 may be different in depth from each of first grooves GV1. In such an embodiment, the third grooves GV3 may be defined or formed deeper than the first grooves GV1.

In an embodiment, each of the third grooves GV3 may be the same in depth as each of the first grooves GV1. However, the disclosure is not limited thereto. In an alternative embodiment, each of the third grooves GV3 may be different in depth from each of first grooves GV1.

The third grooves GV3 may be defined through portions of first, second, third, fourth, and fifth insulating layers INS1, INS2, INS3, INS4 and INS5, which overlap each other. In such an embodiment, as portions of an upper surface of a buffer layer BFL become concave by a certain depth, the third grooves GV3 may be further defined in the buffer layer BFL. The third grooves GV3 may not penetrate the buffer layer BFL. A sixth insulating layer INS6 may fill the third grooves GV3.

Referring to FIGS. 8, 11G, and 12 to 14, when a material such as a pen is dropped on the display panel DP, an external impact may be applied to the display panel DP. In this case, a crack may occur in a pixel PX by such an impact. When a crack occurs in inorganic layers harder than organic layers, the crack may propagate further to the periphery.

The crack may propagate to second and third transistors T2 and T3 through inorganic layers. In this case, the second and third transistors T2 and T3 may be damaged by the crack. Thus, a data voltage Vd may not be effectively applied to a pixel PXij, and a compensation operation of the pixel PXij may fail to be performed. Furthermore, a node ND may maintain an initialization state by a first initialization voltage Vint1.

When the data voltage Vd is not supplied to the pixel PXij, when the node ND is in an initialized state, and when a first voltage ELVDD is supplied to the pixel PXij, a light emitting element OLED may remain on. When a black color is displayed on the image, a bright spot is visible on a black display area in the pixel PXij where the second and third transistors T2 and T3 which are damaged are arranged, because the light emitting element OLED remains on. In this case, because the pixel PXij not to emit light emits light, an image may not be normally displayed.

In an embodiment of the disclosure, first, second, and third grooves GV1, GV2, and GV3 may be defined in a fifth insulating layer INS5 from the buffer layer BFL, which are inorganic layers, around the second and third transistors T2 and T3. In such an embodiment, in a case of propagation of a crack formed in the periphery is blocked by the first, second, and third grooves GV1, GV2, and GV3, damage of the second and third transistors T2 and T3 may be effectively prevented. Thus, as the pixel PXij does not emit light on the black display area, the bright spot is not visible.

According to an embodiment of the disclosure, grooves may be defined or formed in portions of an insulating layer adjacent to second and third transistors, such that a crack is not delivered to the second and third transistors when the crack occurs in inorganic layers by an external impact. As a result, as damage of the second and third transistor is prevented, pixels may be normally driven.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A pixel, comprising:
a light emitting element including an anode and a cathode;
a first transistor connected between the anode and a first power line, wherein the first transistor is switched by a voltage of a node;
a second transistor connected between the first transistor connected to the first power line and a data line, wherein the second transistor is switched by a write scan signal;
a third transistor connected between the node and the anode, wherein the third transistor is switched by a compensation scan signal; and
an insulating layer covering the second and third transistors,
wherein a first groove is defined in a portion of the insulating layer adjacent to the third transistor.

2. The pixel of claim 1, wherein the insulating layer includes:
a buffer layer disposed on a base substrate; and
first, second, third, fourth, and fifth insulating layers sequentially laminated on the buffer layer,
wherein the second transistor is disposed on the buffer layer,
wherein the second insulating layer is disposed on the second transistor,
wherein the third transistor is disposed on the third insulating layer, and
wherein the fifth insulating layer is disposed on the third transistor.

3. The pixel of claim 2, wherein the first groove is defined through portions of the fourth and fifth insulating layers overlapping each other.

4. The pixel of claim 3, wherein the third transistor includes:
a source electrode, a drain electrode, and an active between the source electrode and the drain electrode, wherein the source electrode, the drain electrode, and the active are disposed on the third insulating layer; and
a gate disposed on the fourth insulating layer,
wherein the fourth insulating layer is disposed on the third insulating layer to cover the source electrode, the drain electrode, and the active,
wherein the fifth insulating layer is disposed on the fourth insulating layer to cover the gate, and
wherein the first groove is defined on a portion of a semiconductor pattern which defines the source electrode or the drain electrode.

5. The pixel of claim 4, wherein the first groove exposes the portion of the semiconductor pattern.

6. The pixel of claim 3, wherein a second groove deeper than the first groove is defined in a portion of the insulating layer adjacent to the third transistor.

7. The pixel of claim 6, wherein the second groove is defined through portions of the first, second, third, fourth, and fifth insulating layers overlapping each other.

8. The pixel of claim 7, wherein a portion of an upper surface of the buffer layer is recessed by a predetermined depth to further define the second groove in the buffer layer.

9. The pixel of claim 6, further comprising:
a sixth insulating layer disposed on the fifth insulating layer,
wherein the sixth insulating layer fills the first and second grooves.

10. The pixel of claim 2, wherein a third groove is defined in a portion of the insulating layer adjacent to the second transistor.

11. The pixel of claim 10, wherein the third groove is defined through portions of the first, second, third, fourth, and fifth insulating layers overlapping each other.

12. The pixel of claim 11, wherein a portion of an upper surface of the buffer layer is recessed by a predetermined depth to further define the third groove in the buffer layer.

13. The pixel of claim 2, wherein the first, second, third, fourth, and fifth insulating layers include inorganic layers.

14. The pixel of claim 2, wherein a thickness of each of the third and fifth insulating layers are greater than a thickness of each of the buffer layer and the first, second, and fourth insulating layers.

15. The pixel of claim 2, wherein each of the third and fifth insulating layers includes a plurality of inorganic insulating layers including different materials from each other and laminated with each other.

16. A pixel, comprising:
a light emitting element including an anode and a cathode;
a first transistor connected between the anode and a first power line, wherein the first transistor is switched by a voltage of a node;
a second transistor connected between the first transistor connected to the first power line and a data line, wherein the second transistor is switched by a write scan signal;
a third transistor connected between the node and the anode, wherein the third transistor is switched by a compensation scan signal; and
an insulating layer covering the second and third transistors,
wherein a plurality of grooves are defined in portions of the insulating layer adjacent to the second and third transistors, and
wherein a depth of one of the grooves is different from a depth of another of the grooves.

17. The pixel of claim 16,
wherein a first groove and a second groove are defined in portions of the insulating layer adjacent to the third transistor, wherein a third groove is defined in a portion of the insulating layer adjacent to the second transistor, and wherein a depth of each of the second groove and the third groove is deeper than a depth of the first groove.

18. The pixel of claim 17, wherein the insulating layer includes:

a buffer layer disposed on a base substrate; and first, second, third, fourth, and fifth insulating layers sequentially laminated on the buffer layer, wherein the second transistor is disposed on the buffer layer, wherein the second insulating layer is disposed on the second transistor, wherein the third transistor is disposed on the third insulating layer, and wherein the fifth insulating layer is disposed on the third transistor.

19. The pixel of claim 18, wherein the first groove is defined through portions of the fourth and fifth insulating layers overlapping each other, and wherein the second groove and the third groove are defined through portions of the first, second, third, and fourth, and fifth insulating layers overlapping each other.

20. A display device, comprising:

a pixel, wherein the pixel includes:

a light emitting element including an anode and a cathode;

a first transistor connected between the anode and a first power line, wherein the first transistor is switched by a voltage of a node;

a second transistor connected between the first transistor connected to the first power line and a data line, wherein the second transistor is switched by a write scan signal;

a third transistor connected between the node and the anode, wherein the third transistor is switched by a compensation scan signal; and an insulating layer covering the second and third transistors, wherein a first groove and a second groove are defined in portions of the insulating layer adjacent to the third transistor, and wherein the first groove and the second groove have different depths from each other.

* * * * *